US012810935B2

(12) United States Patent
Kubota

(10) Patent No.: US 12,810,935 B2
(45) Date of Patent: Nov. 24, 2026

(54) MEMORY DEVICE

(71) Applicant: Kioxia Corporation, Tokyo (JP)

(72) Inventor: Yoshihiro Kubota, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 406 days.

(21) Appl. No.: 18/429,796

(22) Filed: Feb. 1, 2024

(65) Prior Publication Data

US 2024/0265968 A1 Aug. 8, 2024

(30) Foreign Application Priority Data

Feb. 8, 2023 (JP) ................................ 2023-017848

(51) Int. Cl.

| | |
|---|---|
| ***G11C 16/04*** | (2006.01) |
| ***H10B 41/10*** | (2023.01) |
| ***H10B 41/27*** | (2023.01) |
| ***H10B 41/35*** | (2023.01) |
| ***H10B 41/40*** | (2023.01) |
| ***H10B 43/10*** | (2023.01) |
| ***H10B 43/27*** | (2023.01) |
| ***H10B 43/35*** | (2023.01) |
| ***H10B 43/40*** | (2023.01) |
| ***H10W 20/41*** | (2026.01) |
| ***H10W 20/42*** | (2026.01) |
| ***H10W 90/00*** | (2026.01) |
| ***H10W 90/20*** | (2026.01) |

(52) U.S. Cl.

CPC ......... *G11C 16/0483* (2013.01); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02); *H10W 20/42* (2026.01); *H10W 20/435* (2026.01); *H10W 90/00* (2026.01); *H10W 90/297* (2026.01)

(58) Field of Classification Search

CPC ...................................................... H10B 43/35

See application file for complete search history.

(56) References Cited

U.S. PATENT DOCUMENTS

| | | | |
|---|---|---|---|
| 11,063,062 | B2 | 7/2021 | Iijima et al. |
| 11,600,585 | B2 | 3/2023 | Horiuchi |

(Continued)

FOREIGN PATENT DOCUMENTS

| | | |
|---|---|---|
| JP | 2020-150037 A | 9/2020 |
| JP | 2021-48249 A | 3/2021 |

(Continued)

*Primary Examiner* — Erik Kielin

(74) *Attorney, Agent, or Firm* — Oblon, McClelland, Maier & Neustadt, L.L.P.

(57) ABSTRACT

According to one embodiment, a device includes: a second chip bonded to a first chip including: a first area; a second area including a first opening of a first layer; and a third area including a second opening of a layer between the first and second areas. The first opening has a tapered shape in which a dimension of a part on the first chip side of the first opening is smaller than a dimension of a part on the second chip side of the first opening. An angle between a side surface of the second opening and a part on the first chip side of the second opening is closer to 90 degrees than an angle between a side surface of the first opening and the part on the first chip side of the first opening.

18 Claims, 24 Drawing Sheets

(56) References Cited

U.S. PATENT DOCUMENTS

| | | | | |
|---|---|---|---|---|
| 11,626,376 | B2 | 4/2023 | Setta | |
| 11,688,720 | B2 | 6/2023 | Uchiyama | |
| 2021/0082897 | A1* | 3/2021 | Okada | G11C 16/30 |
| 2022/0059481 | A1* | 2/2022 | Shibata | H10W 90/00 |
| 2022/0077089 | A1* | 3/2022 | Watanabe | H10W 90/00 |
| 2022/0084970 | A1* | 3/2022 | Tomimatsu | H10W 20/023 |
| 2022/0130782 | A1* | 4/2022 | Ahn | H10B 43/50 |
| 2022/0270992 | A1* | 8/2022 | Wada | H10W 90/00 |
| 2023/0361033 | A1* | 11/2023 | Jeon | H10B 41/27 |
| 2024/0062819 | A1* | 2/2024 | Park | G11C 16/08 |

FOREIGN PATENT DOCUMENTS

| | | | |
|---|---|---|---|
| JP | 2022-35158 | A | 3/2022 |
| JP | 2022-41052 | A | 3/2022 |
| JP | 2022-45192 | A | 3/2022 |

* cited by examiner

MEMORY DEVICE

CROSS-REFERENCE TO RELATED APPLICATIONS

This application is based upon and claims the benefit of priority from Japanese Patent Application No. 2023-017848, filed Feb. 8, 2023, the entire contents of which are incorporated herein by reference.

FIELD

Embodiments described herein relate generally to a memory device.

BACKGROUND

A NAND flash memory is known as a memory device capable of storing data in a non-volatile manner.

BRIEF DESCRIPTION OF THE DRAWING(S)

DETAILED DESCRIPTION

Embodiment

A memory device according to an embodiment and a method of manufacturing the memory device will be described with reference to FIGS. 1 to 24.

Hereinafter, the present embodiment will be described in detail with reference to the drawings. In the following description, elements with a same function and a same configuration will be denoted by a same reference sign. In addition, in each embodiment described below, if components (for example, circuits, interconnect, and various voltages and signals) suffixed by a reference sign accompanied by numerals/alphabetical characters for differentiation need not be differentiated from each other, a description (reference sign) omitting the suffixed numerals/alphabetical characters will be used.

In general, according to one embodiment, a memory device includes: a first chip which includes a substrate and a circuit on the substrate; and a second chip which is bonded to the first chip, wherein the second chip includes: a first area which includes a first source line and a first memory cell array connected to the first source line; a second area which includes a first layer provided at a first height same as the first source line in a first direction perpendicular to a surface of the substrate and a contact portion provided in a first opening formed in the first layer, the contact portion including a member which extends in the first direction from the first opening and which is electrically connected to the circuit; and a third area which includes a first structure provided in a second opening formed in a layer at the first height between the first area and the second area, the first opening has a tapered shape in which a dimension in a second direction of a part on a side of the first chip of the first opening is smaller than a dimension in the second direction of a part on a side of the second chip of the first opening, the second direction being parallel to the surface of the substrate, and an angle formed between a side surface of the second opening and a part on the side of the first chip of the second opening is closer to 90 degrees than an angle formed between a side surface of the first opening and the part on the side of the first chip of the first opening.

(1) Configuration (1-1) Overall Configuration of Memory Device

Figure 1:
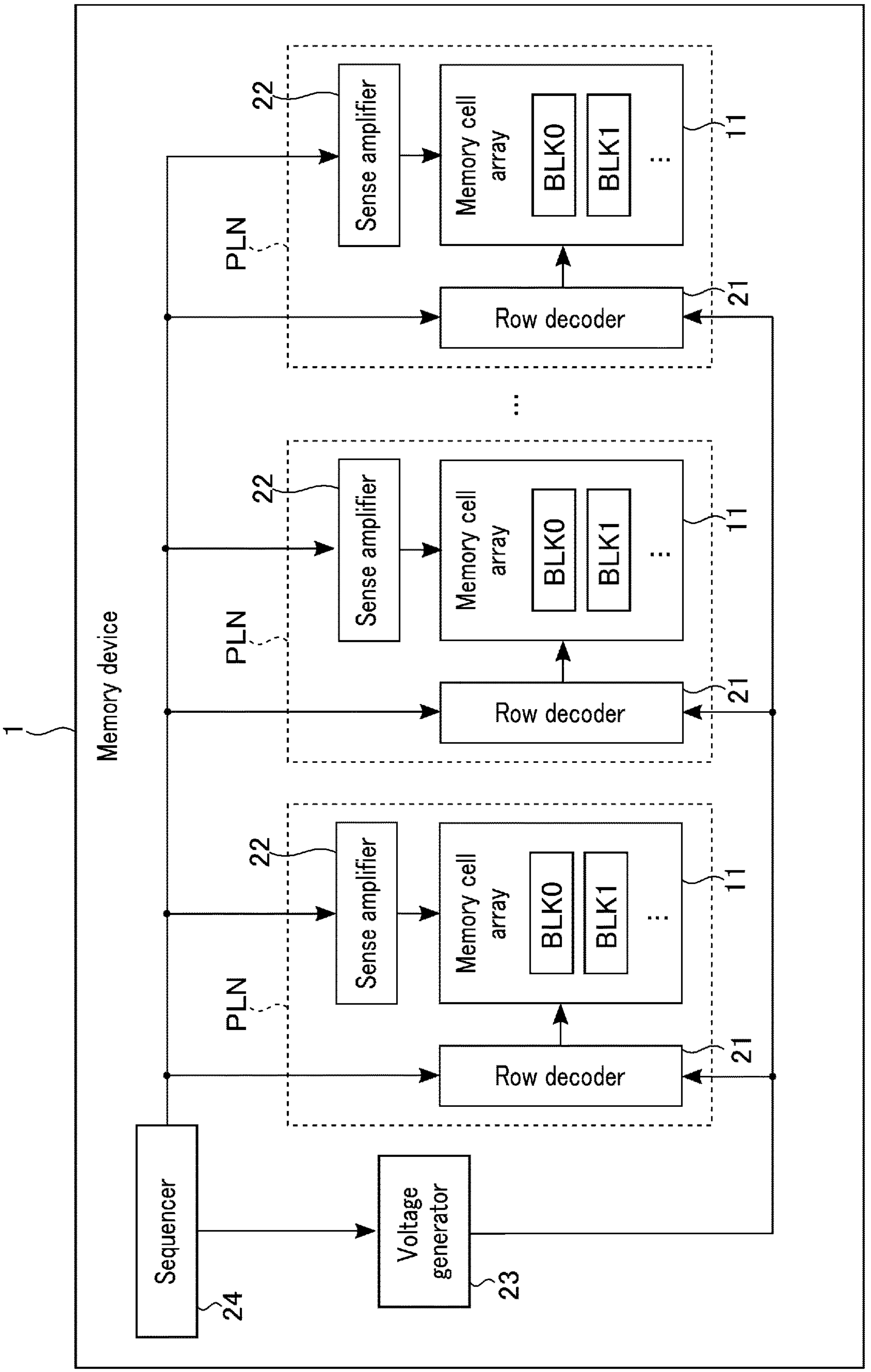
FIG. 1 is a block diagram showing a configuration example of a memory device according to an embodiment.

An example of an overall configuration of a memory device 1 according to the present embodiment will be described with reference to FIG. 1. FIG. 1 is a block diagram showing an overall configuration of the memory device 1 according to the present embodiment. While a part of connections of each component is depicted by an arrow line in FIG. 1, connections among components are not limited thereto.

The memory device 1 is, for example, a three-dimensional stacked NAND flash memory. The three-dimensional stacked NAND flash memory includes a plurality of memory cells (hereinafter, also referred to as memory cell transistors) which are three-dimensionally arranged on a semiconductor substrate.

As shown in FIG. 1, the memory device 1 according to the present embodiment includes a plurality of planes PLN, a voltage generator 23, and a sequencer 24.

Each of the plurality of planes PLN is a circuit group which can operate independently from each other and in parallel (concurrently) with each other. Each of the plurality of planes PLN includes memory cell arrays 11, a row decoder 21, and a sense amplifier 22.

Each memory cell array 11 includes a plurality of blocks BLK. Each block BLK is, for example, a set of a plurality of memory cells from which data is collectively erased. The memory cells are three-dimensionally arranged in the memory cell array 11. The plurality of memory cells in each block BLK are associated with a row and a column. Details of internal configurations of the memory cell arrays 11 and the blocks BLK will be provided later.

The row decoder 21 is a circuit which decodes a row address. The row address is an address signal which designates interconnect in a row direction of the memory cell array 11. Based on a decode result of the row address, the row decoder 21 supplies the memory cell array 11 with a voltage used to operate the memory cell array 11.

The sense amplifier 22 is a circuit which writes and reads data. During a read operation, the sense amplifier 22 senses data read from the memory cell array 11. During a write operation, the sense amplifier 22 supplies the memory cell array 11 with a voltage in accordance with write data.

The voltage generator 23 is a circuit which generates various voltages to be used in a write operation, a read operation, an erase operation, and the like. For example, the voltage generator 23 is connected to the row decoder 21 and the sense amplifier 22 of each plane PLN. The voltage generator 23 supplies a generated voltage to each row decoder 21 and each sense amplifier 22.

The sequencer 24 is a control circuit of the memory device 1. The sequencer 24 controls operations of the entire memory device 1. For example, the sequencer 24 is connected to the row decoder 21, the sense amplifier 22, and the voltage generator 23. The sequencer 24 controls the row decoder 21, the sense amplifier 22, and the voltage generator 23. Based on control by an external controller (not illustrated), the sequencer 24 executes a write operation, a read operation, an erase operation, and the like with respect to the memory cell array 11.

Hereinafter, a group of circuits for controlling operations of the memory cell array 11 such as the row decoder 21, the sense amplifier 22, the voltage generator 23, and the sequencer 24 is also referred to as a CMOS circuit (or a peripheral circuit).

(1-2) Circuit Configuration of Memory Cell Array

Figure 2:
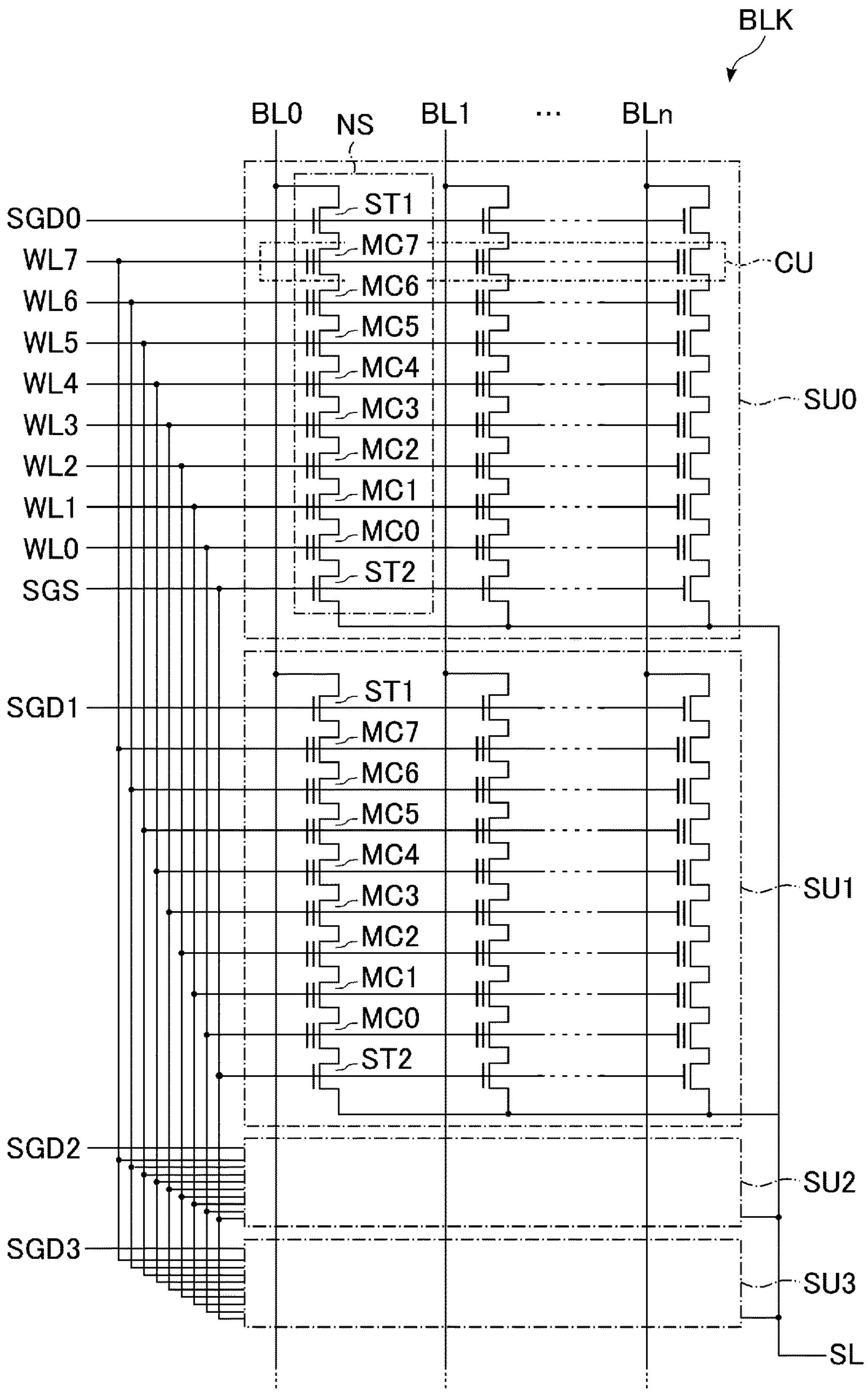
FIG. 2 is a circuit diagram of a memory cell array of the memory device according to the embodiment.

An example of a circuit configuration of the memory cell array 11 will be described with reference to FIG. 2. FIG. 2 is a circuit diagram of the memory cell array 11. The example in FIG. 2 represents a circuit configuration of one block BLK.

As shown in FIG. 2, the block BLK includes a plurality of string units SU. The string unit SU is, for example, a set of a plurality of NAND strings NS which are collectively selected in a write operation or a read operation. A NAND string NS includes a set of a plurality of memory cells MC connected in series. For example, one block BLK includes four string units SU0, SU1, SU2, and SU3.

Note that the number of blocks BLK in the memory cell array 11 and the number of string units SU in a block BLK are optional.

Each NAND string NS includes a plurality of memory cells MC, a select transistor ST1, and a select transistor ST2. In the example in FIG. 2, the NAND string NS includes eight memory cells MC0, MC1, . . . , MC6, and MC7. Note that the number of memory cell transistors MC included in the NAND string NS is optional.

A memory cell MC is a memory element which stores data in a non-volatile manner. The memory cell MC is a transistor which includes a control gate and a charge storage layer. The memory cell MC may be a MONOS (Metal-Oxide-Nitride-Oxide-Silicon) transistor or an FG (Floating Gate) transistor. In a MONOS memory cell transistor, an insulating layer such as a silicon nitride layer is used in the charge storage layer. In an FG memory cell transistor, a conductive layer such as a polysilicon layer is used in the charge storage layer. Hereinafter, a case where the memory cell MC is a MONOS transistor will be described.

The select transistors ST1 and ST2 are switching elements. Each of the select transistors ST1 and ST2 is used to select a string unit SU during various operations of the memory device 1. The number of each of the select transistors ST1 and ST2 included in the NAND string NS is optional. One or more of each of the select transistors ST1 and ST2 may be included in the NAND string NS.

A current path of the select transistor ST2, a current path of the memory cells MC0, . . . , and MC7, and a current path of the select transistor ST1 in the NAND string NS are connected in series. A drain of the select transistor ST1 is connected to a bit line BL. A source of the select transistor ST2 is connected to a source line SL.

Each of control gates of the memory cells MC0, . . . , and MC7 in a same block BLK is connected to one corresponding word line among word lines WL0, . . . , and WL7. Each of the four string units SU includes the memory cell MC0. The control gates of the plurality of memory cells MC0 in the block BLK are commonly connected to one word line WL0. The memory cells MC1, . . . , and MC7 are also respectively connected to corresponding word lines WL1, . . . , and WL7 in a similar manner to the memory cell MC0.

Gates of the plurality of select transistors ST1 in the string unit SU are commonly connected to one select gate line SGD. More specifically, the gates of the plurality of select transistors ST1 in the string unit SU0 are commonly connected to the select gate line SGD0. The gates of the plurality of select transistors ST1 in the string unit SU1 are commonly connected to the select gate line SGD1. The gates of the plurality of select transistors ST1 in the string unit SU2 are commonly connected to the select gate line SGD2.

The gates of the plurality of select transistors ST1 in the string unit SU3 are commonly connected to the select gate line SGD3.

Gates of the plurality of select transistors ST2 in the block BLK are commonly connected to one select gate line SGS. A plurality of different select gate lines SGS may be provided in the block BLK for each string unit SU in a similar manner to the select gate lines SGD.

The word lines WL0, . . . , and WL7, the select gate lines SGD0, . . . , and SGD3, and the select gate line SGS are respectively connected to the row decoder 21.

Bit lines BL are commonly connected to one NAND string NS in each string unit SU of each block BLK. A same column address is assigned to a plurality of NAND strings NS connected to one bit line BL. Each bit line BL is connected to the sense amplifier 22.

The source line SL is shared among, for example, a plurality of blocks BLKs.

A set of a plurality of memory cells MC connected to a common word line WL in one string unit SU will be notated as, for example, a cell unit CU. For example, a write operation and a read operation are executed in units of a cell unit CU.

(1-3) Bond Structure of Memory Device

Figure 3:
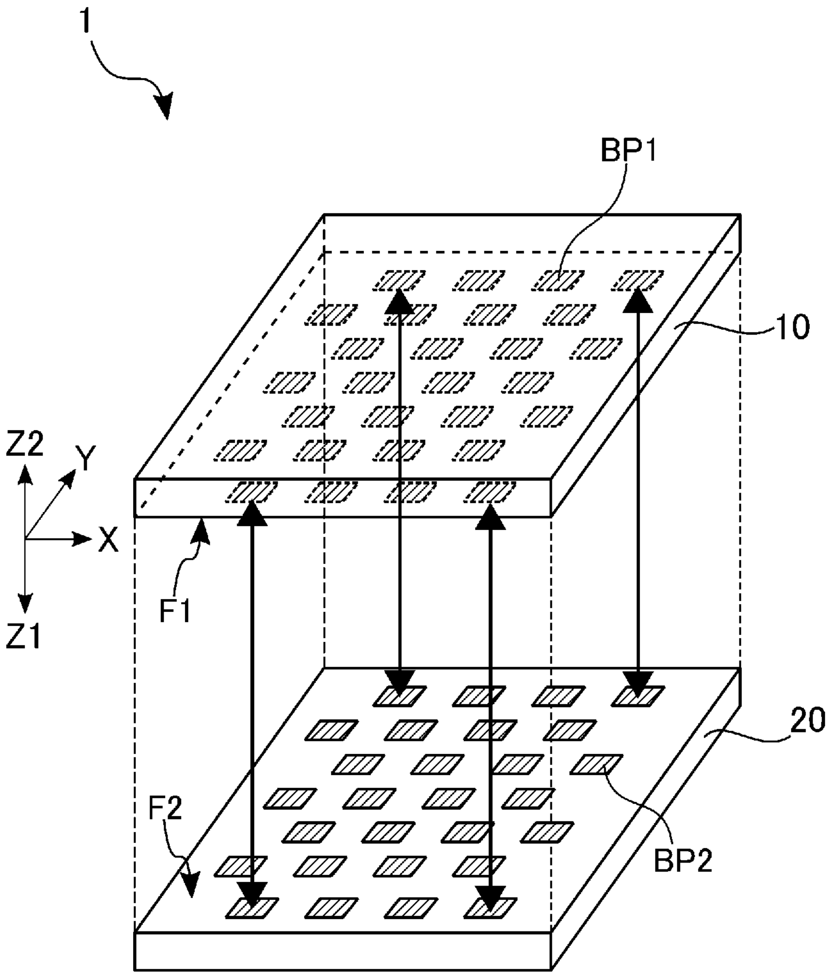
FIG. 3 is a schematic diagram of a bond structure of the memory device according to the embodiment.

An outline of a structure of the memory device 1 according to the present embodiment will be described with reference to FIG. 3. FIG. 3 is a bird's-eye view showing an outline of a bond structure of the memory device 1.

As shown in FIG. 3, the memory device 1 according to the present embodiment includes two semiconductor chips 10 and 20.

One of the two semiconductor chips 10 and 20 is an array chip (also called a memory cell array chip) 10. The array chip 10 is a chip provided with a plurality of memory cell arrays 11.

The other of the two semiconductor chips 10 and 20 is a CMOS circuit chip (also called a CMOS chip) 20. The CMOS circuit chip 20 is a chip provided with a CMOS circuit which controls the array chip 10.

The memory device 1 according to the present embodiment is formed by bonding of the array chip 10 and the CMOS circuit chip 20. The memory device 1 has a structure (hereinafter, notated as a "bond structure") in which the array chip 10 and the CMOS circuit chip 20 are bonded to each other. Hereinafter, in a case where the array chip 10 and the CMOS circuit chip 20 are not differentiated, each of the array chip 10 and the CMOS circuit chip 20 will be simply notated as a chip.

Note that a plurality of the array chips 10 may be provided in the memory device 1. In this case, bonding may be performed so that the plurality of array chips 10 are stacked on the CMOS circuit chip 20. A plurality of the CMOS circuit chips 20 may be provided in the memory device 1.

As shown in FIG. 3, the array chip 10 includes a plurality of pads (electrode, conductive layer, conductor) BP1 on a surface F1. The CMOS circuit chip 20 includes a plurality of pads BP2 on a surface F2. The pads BP1 and BP2 are used to bond the two chips to each other.

In the memory device 1 with the bond structure, the surface F1 of the array chip 10 is bonded to the surface F2 of the CMOS circuit chip 20. In this manner, the surface F1 provided with the pads BP1 of the array chip 10 faces the surface F2 provided with the pads BP2 of the CMOS circuit chip 20. Hereinafter, the surfaces F1 and F2 where the array chip 10 and the CMOS circuit chip 20 are bonded to each other will also be notated as bond surfaces BF.

In the bond structure, the pads BP1 of the array chip 10 and the pads BP2 of the CMOS circuit chip 20 are bonded to each other. Accordingly, one bond pad BP is formed in the memory device 1.

In other words, the electrode constituting the pad BP1 provided on the array chip 10 is bonded to the electrode constituting the pad BP2 provided on the CMOS circuit chip 20. Accordingly, the bond pad BP of the memory device 1 with the bond structure is formed.

The bond pad BP includes an active pad and a dummy pad. The active pad functions as a path of signals or power during operations of the memory device 1. The active pad is electrically connected to a path of any of signals and power. The dummy pad does not function as a path of signals and a path of power during operations of the memory device 1. The dummy pad is not electrically connected to a path of signals and a path of power.

Hereinafter, the surface (bond surface BF) where the array chip 10 and the CMOS circuit chip 20 are bonded to each other will be referred to as an XY surface. Directions mutually orthogonal in the XY surface will be referred to as an X direction and a Y direction. The X direction and the Y direction are directions parallel to an XY plane. A direction which is approximately orthogonal to the XY plane and which is oriented from the array chip 10 toward the CMOS circuit chip 20 will be referred to as a Z1 direction. A direction which is approximately orthogonal to the XY plane and which is oriented from the CMOS circuit chip 20 toward the array chip 10 will be referred to as a Z2 direction. In a case where the Z1 direction and the Z2 direction are not differentiated, a direction approximately orthogonal to the XY plane will be notated as a Z direction.

(1-4) Planer Layout of Memory Device

Figure 4:
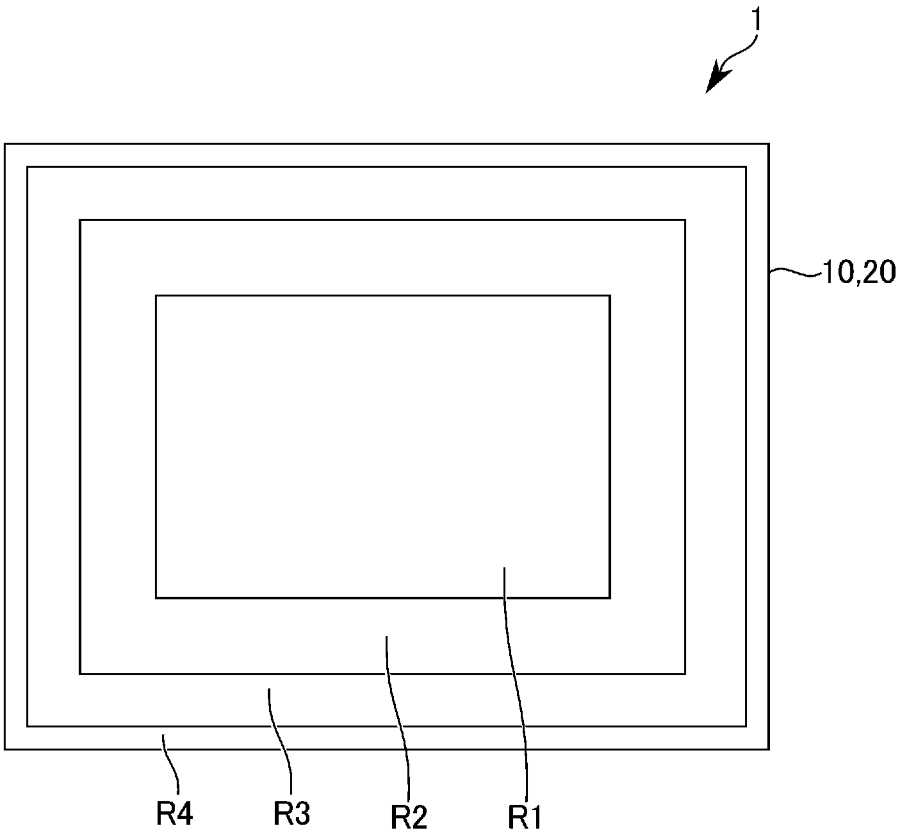
FIG. 4 is a plan view of the memory device according to the embodiment.

An example of a planar layout in a chip of the memory device 1 according to the present embodiment will be described with reference to FIG. 4. FIG. 4 is a plan view of the memory device 1.

As shown in FIG. 4, in the planer layout of the memory device 1, each of the semiconductor chips 10 and 20 includes a core region R1, a wall region R2, an outer peripheral region R3, and a kerf region R4.

The core region R1 is arranged in a central part of each of the semiconductor chips 10 and 20. The core region R1 of the array chip 10 includes a memory cell array, a plurality of contacts, and a plurality of pads. The core region R1 of the CMOS circuit chip 20 includes a field-effect transistor (for example, a MOS transistor), a resistor, a capacitor, a plurality of contacts, and a plurality of pads.

The wall region R2 is provided so as to enclose an outer periphery of the core region R1. The wall region R2 is, for example, a rectangular annular region. A conductive sealing member (protective structure) is provided in the wall region R2. The sealing member fixes a potential of the outer periphery of the memory device 1 to a given potential (for example, a ground potential VSS). Accordingly, potentials of a power source line, a well, and the like of the memory device 1 are stabilized. For example, the sealing member provided in the wall region R2 has a function of releasing static electricity to a substrate. Accordingly, breakage of an element and the like by static electricity is suppressed. For example, in a case where a crack or a separation of an interlayer insulator film or the like occurs at an end of a chip of the memory device 1 in a dicing step, the sealing member in the wall region R2 prevents the crack and/or the separation from reaching an inner side of the memory device 1.

The outer peripheral region R3 is provided so as to enclose an outer periphery of the wall region R2. The outer peripheral region R3 is, for example, a rectangular annular region. For example, in the array chip 10, the outer peripheral region R3 is a region in which a conductive discharge member is to be formed. The discharge member grounds a semiconductor layer above a wafer during a manufacturing step of the array chip 10 by electrically connecting the semiconductor layer to the wafer. For example, the discharge member is used to suppress dielectric breakdown (arcing) due to a charge-up of a semiconductor layer during reactive ion etching (RIE). For example, the discharge member is removed during a manufacturing step of the memory device 1 after the array chip 10 and the CMOS circuit chip 20 are bonded to each other. An insulator is provided in a part (region) where the discharge member has been removed in the outer peripheral region R3.

The kerf region R4 is provided so as to enclose an outer periphery of the outer peripheral region R3. The kerf region R4 is, for example, a rectangular annular region. The kerf region R4 is an end region including a chip end. The kerf region R4 is a region provided between a plurality of chips formed on the wafer. Due to the kerf region R4 being cut in a dicing step, the plurality of chips formed on the wafer are diced into respective chips.

Note that in the present embodiment, an outer periphery refers to a part closer to an end side of a chip than to a given part of the chip in the XY plane.

(1-5) Sectional Structure of Memory Device

Figure 5:
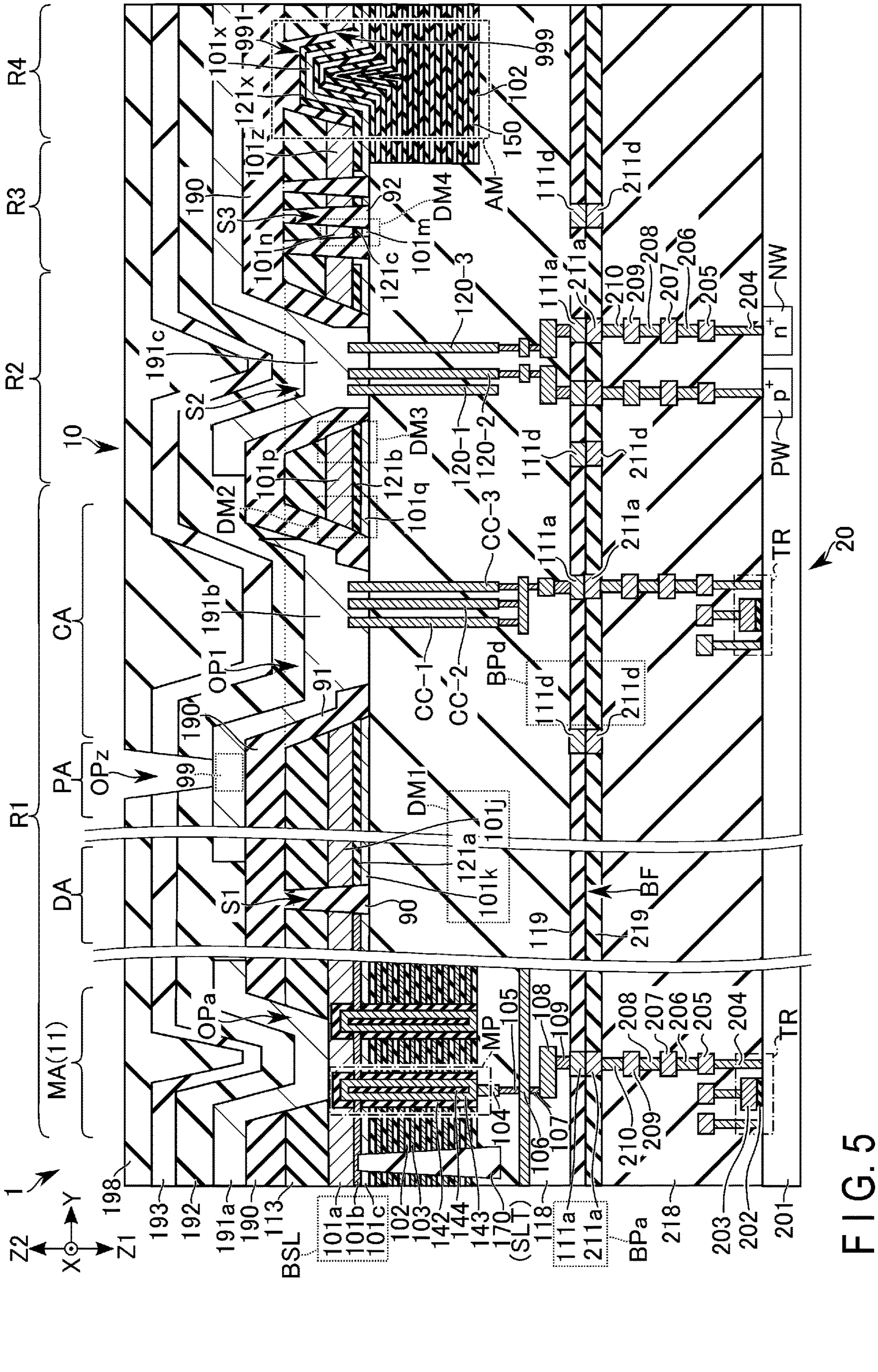
FIG. 5 is a sectional view showing a structure example of the memory device according to the embodiment.

An example of a sectional structure of the memory device 1 according to the present embodiment will be described with reference to FIG. 5. FIG. 5 is a sectional view showing an example of a sectional structure of the memory device 1. In the example in FIG. 5, a part of the components of the memory device 1 according to the present embodiment are extracted and shown.

As shown in FIG. 5, the memory device 1 according to the present embodiment has a bond structure between the array chip 10 and the CMOS circuit chip 20.

The array chip 10 includes a separation member 90, an embedded member 92, a semiconductor layer 101, insulating layers 102, 113, 118, 119, 121 (121*a*, 121*b*, 121*c*, and 121*x*), 150, 190, 192, and 193, a conductive layer 103, interconnects (conductive layers) 106, 108, 191 (191*a*, 191*b*, and 191*c*), conductors 104, 105, 107, and 109, a contact plug CC, an electrode (pad) 111, a wall structure 120, a surface protective layer 198, and a memory pillar MP. The semiconductor layer 101 includes semiconductor layers 101*a*, 101*b*, 101*c*, 101*j*, 101*k*, 101*m*, 101*n*, 101*p*, 101*q*, 101*x*, and 101*z*. The electrode 111 used in the bond pad BP includes electrodes 111*a* and 111*d*.

The CMOS circuit chip 20 includes a semiconductor substrate 201, an N-type impurity diffusion layer (N-type semiconductor region) NW, a P-type impurity diffusion layer (P-type semiconductor region) PW, a transistor TR, conductors (plugs) 204, 206, 208, and 210, interconnects 205, 207, and 209, an electrode (pad) 211, and insulating layers 218 and 219. The transistor TR includes a gate insulating layer 202, a gate electrode 203, and a source/drain layer (not illustrated). The electrode 211 used in the bond pad BP includes electrodes 211*a* and 211*d*.

(1-5-1) Structure of Array Chip

A structure of the array chip 10 in the memory device 1 according to the present embodiment will be described with reference to FIGS. 5 and 6.

<Planer Layout of Array Chip>

A planer layout of the array chip 10 in the memory device 1 according to the present embodiment will be described with reference to FIG. 6. FIG. 6 is a plan view showing an example of a planer layout structure of the array chip 10.

Figure 6:
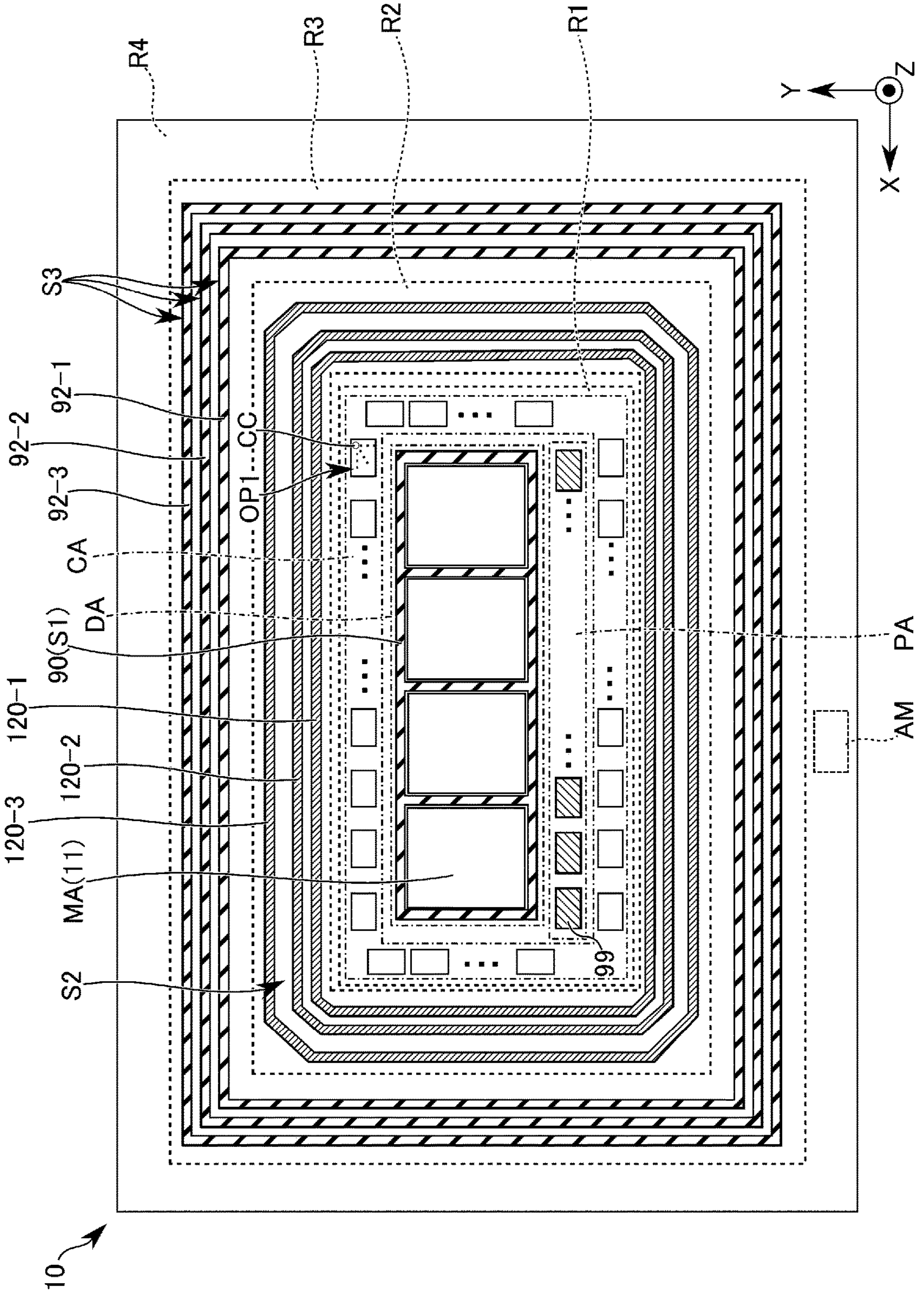
FIG. 6 is a plan view showing a structure example of an array chip of the memory device according to the embodiment.

As shown in FIG. 6, a core region R1 is provided in a central part of the array chip 10. The core region R1 of the array chip 10 includes a plurality of memory cell array areas MA, a contact area CA, a pad area PA, and a plane separation area DA.

The plurality of memory cell array areas MA are lined up in the X direction in the core region R1. Each of the plurality of memory cell array areas MA includes the memory cell array 11.

The contact area CA is arranged in the core region R1 so as to enclose a periphery of the plurality of memory cell array areas MA. The contact area CA includes a plurality of plug arrangement portions. The plurality of contact plugs CC to be described later are provided in an opening OP1 of each plug arrangement portion.

The pad area PA is arranged in a region between the contact area CA and the memory cell array areas MA. The pad area PA includes a plurality of pads 99. For example, the pads 99 inside the pad area PA are external connecting terminals. The pads 99 are electrically connected to the contact plugs CC in the contact area CA, interconnects in the memory cell array areas MA and/or interconnects in the CMOS circuit chip 20, and the like.

The plane separation area DA partitions the memory cell array areas MA. The plane separation area DA encloses each of the memory cell array areas MA (memory cell arrays 11). The plane separation area DA separates the plurality of memory cell arrays 11 into each plane. The plane separation area DA has a grid-like layout as viewed from a Z direction. The plane separation area DA is respectively laid out between two memory cell array areas MA, between a memory cell array area MA and the contact area CA, and between a memory cell array area MA and the pad area PA.

The plane separation area DA includes a grid-like slit (opening) S1 as viewed from a Z direction. The separation member 90 is provided in the slit S1. The separation member 90 is an insulator. The separation member 90 has a grid-like structure in accordance with the shape of the slit S1. The slit S1 and the separation member 90 have a part that extends in the X direction and a part that extends in the Y direction.

The wall region R2 of the array chip 10 includes a plurality of wall structures (also referred to as edge seals) 120. As described above, the wall structures 120 are conductive sealing members. For example, each wall structure 120 has an approximately rectangular annular shape as viewed from the Z direction. For example, three wall structures 120-1, 120-2, and 120-3 are provided in three slits (openings) S2 in the wall region R2. The wall structure 120-1 encloses an outer periphery of the core region R1 as viewed from the Z direction. The wall structure 120-2 encloses an outer periphery of the wall structure 120-1 as viewed from the Z direction. The wall structure 120-3 encloses an outer periphery of the wall structure 120-2 as viewed from the Z direction. The wall structure 120-2 is provided in a region between the wall structure 120-1 and the wall structure 120-3.

In the example in FIG. 6, three wall structures 120 are provided in the wall region R2. The number of wall structures 120 provided in the wall region R2 may be less than three or more than three. The shape of the wall structures 120 need not be a rectangular annular shape as long as the shape encloses the outer periphery of the core region R1. Each wall structure 120 may be divided into a plurality of parts.

The outer peripheral region R3 is provided between the wall region R2 and the kerf region R4. The outer peripheral region R3 of the array chip 10 includes a plurality of slits (openings) S3. The embedded member 92 which is an insulator is provided in each slit S3. The slits S3 and the embedded members 92 have an approximately rectangular annular shape as viewed from the Z direction.

Three embedded members 92-1, 92-2, and 92-3 enclose the core region R1 and the wall region R2. The embedded member 92-1 encloses an outer periphery of the wall region R2 as viewed from the Z direction. The embedded member 92-2 encloses an outer periphery of the embedded member 92-1 as viewed from the Z direction. The embedded member 92-3 encloses an outer periphery of the embedded member 92-2 as viewed from the Z direction.

In the example in FIG. 6, three embedded members 92 and slits S3 with rectangular annular shapes are provided in the outer peripheral region R3. The number of embedded members 92 and the number of slits S3 provided in the outer peripheral region R3 may be less than three or more than three. The shapes of the embedded members 92 and the slits S3 need not be rectangular annular shapes. Each of the embedded members 92 may be divided into a plurality of parts.

The kerf region R4 is a region including an end of the array chip 10. For example, an alignment mark AM, a pattern for checking properties, and the like to be used when manufacturing the memory device 1 are provided in the kerf region R4. A structure in the kerf region R4 may be cut or removed by the dicing step.

<Structure of Core Region>

The core region R1 of the array chip 10 will be described. The memory cell array 11 and various members for connecting the memory cell array 11 and the CMOS circuit chip 20 to each other are provided in the core region R1 of the array chip 10.

As shown in FIGS. 5 and 6, the core region R1 includes the plurality of memory cell array areas MA, the contact area CA, the pad area PA, and the plane separation area DA.

The memory cell array area MA will be described.

As shown in FIG. 5, in the memory cell array area MA, the semiconductor layer 101 (101*a*, 101*b*, and 101*c*) extends in the X direction and in the Y direction. The semiconductor layer 101 provided in the memory cell array area MA functions as a source line SL. For example, the semiconductor layer 101 includes silicon. The semiconductor layer 101 as the source line SL includes three semiconductor layers 101*a*, 101*b*, and 101*c* stacked in the Z direction. Hereinafter, a set of the three semiconductor layers 101*a*, 101*b*, and 101*c* which function as the source line SL will also be notated as a source line layer BSL.

In the memory cell array area MA, a plurality of insulating layers 102 and a plurality of conductive layers 103 are alternately stacked one layer at a time on a surface facing the Z1 direction of the semiconductor layer 101. A stacked body including the plurality of insulating layers 102 and the plurality of conductive layers 103 is provided in the memory cell array area MA. The plurality of conductive layers 103 stacked so as to be separated in the Z direction by the insulating layers 102 are provided between the CMOS circuit chip 20 and the semiconductor layer 101. In the example in FIG. 5, ten insulating layers 102 and ten conductive layers 103 are alternately stacked one layer at a time. The number of insulating layers 102 and the number of conductive layers 103 stacked in the Z direction are set in accordance with a configuration (for example, storage capacity) of the memory cell array 11.

The plurality of conductive layers 103 which extend in the X direction function as any of a word line WL, a select gate line SGD, and a select gate line SGS. For example, the conductive layers 103 include a conductive material such as tungsten (W).

The insulating layers 102 separate two conductive layers 103 which are adjacent to each other in the Z direction. The insulating layers 102 include an insulation material such as silicon oxide.

A plurality of memory pillars MP are provided in the memory cell array area MA. One memory pillar MP corresponds to one NAND string NS. For example, the memory pillars MP have a columnar shape that extends in the Z direction. The memory pillars MP penetrate (pass through) the plurality of insulating layers 102 and the plurality of conductive layers 103.

Side faces (a surface that intersects the XY plane) of the memory pillars MP oppose the conductive layers 103. An end of the memory pillars MP in the Z2 direction reaches inside the semiconductor layer 101. The memory pillars MP include a memory layer 142, a semiconductor layer 143, and a core layer 144. The semiconductor layer 143 extends in the Z direction. A part of the semiconductor layer 143 comes into contact with the semiconductor layer 101. Details of a structure of the memory pillars MP will be provided later.

For example, a slit SLT that extends in the X direction is provided in the stacked body including the insulating layers 102 and the conductive layers 103. An insulator 170 fills the inside of the slit SLT. The insulator 170 penetrates the plurality of insulating layers 102 and the plurality of conductive layers 103. An end of the insulator 170 in the Z1 direction (a lower end of the insulator 170) is positioned in an insulating layer 118. The end of the insulator 170 in the Z1 direction comes into contact with the insulating layer 118. An end of the insulator 170 in the Z2 direction (an upper end of the insulator 170) is positioned in the source line layer BSL. The end of the insulator 170 in the Z2 direction comes into contact with the semiconductor layer 101*b*. The insulator 170 divides conductive layers 103 that are adjacent in the Y direction on both sides of the insulator 170. For example, a region separated by the insulator 170 (and the slit SLT) corresponds to one block BLK. For example, the insulator 170 includes silicon oxide. The slit SLT may be filled with a conductive material such as a metal or a semiconductor at least with its side surface being enclosed by an insulation material such as silicon oxide.

The slit SLT is used in a forming step of the memory cell array 11 as an opening through which an etching agent for replacing a sacrificial layer between the semiconductor layers 101*a* and 101*c* of the source line layer BSL with the semiconductor layer 101*b* and a raw material of the semiconductor layer 101*b* are to be supplied. The slit SLT is used in a forming step of the memory cell array 11 as an opening through which an etching agent for replacing a sacrificial layer between the insulating layers 102 with the conductive layer 103 and a raw material of the conductive layer 103 are to be supplied.

A dimension of the insulator 170 (and the slit SLT) in the Y direction on the side of the Z1 direction (side of CMOS circuit chip 20) is larger than a dimension of the insulator 170 in the Y direction on the side of the Z2 direction (side of array chip 10).

Note that the slit SLT and the insulator 170 do not divide the source line layer BSL into a plurality of parts (for example, a part for each plane PLN).

The conductor 104 is provided on a surface facing the Z1 direction of the memory pillar MP. For example, the conductor 104 has a columnar shape that extends in the Z direction. The conductor 105 is provided on a surface facing the Z1 direction of the conductor 104. For example, the conductor 105 has a columnar shape that extends in the Z direction. The interconnect 106 is provided on a surface facing the Z1 direction of the conductor 105. A plurality of interconnects 106 lined up in the X direction are provided in the memory cell array area MA. Each of the plurality of interconnects 106 extends in the Y direction. Each of the plurality of memory pillars MP is electrically connected to any one of the plurality of interconnects 106 via the conductors 104 and 105. The interconnect 106 functions as a bit line BL. For example, the conductor 104 includes tungsten. For example, the conductor 105 and the interconnect 106 include copper (Cu).

The conductor 107 is provided on a surface facing the Z1 direction of the interconnect 106. For example, the conductor 107 has a columnar shape that extends in the Z direction. The interconnect 108 is provided on a surface facing the Z1 direction of the conductor 107. The conductor 109 is provided on a surface facing the Z1 direction of the interconnect 108. For example, the conductor 109 has a columnar shape that extends in the Z direction. For example, the conductors 107 and 109 and the interconnect 108 include copper.

The insulating layer 118 is provided in the array chip 10 on a side of the surface facing the Z1 direction of the semiconductor layer 101. The insulating layer 118 covers the insulating layer 102, the conductive layer 103, the memory pillar MP, the conductors 104, 105, 107, and 109, and the interconnects 106 and 108.

The insulating layer 119 is provided on a surface facing the Z1 direction of the insulating layer 118. The insulating layer 119 comes into contact with the insulating layer 219 of the CMOS circuit chip 20. A surface where the insulating layer 119 and the insulating layer 219 come into contact with each other is a bond surface BF.

The plurality of electrodes 111 are provided in a same hierarchical level as the insulating layer 119. The electrode 111 is arranged in the insulating layer 119. In the core region R1, the electrode 111 has a rectangular shape as viewed from the Z direction. In the memory cell array area MA, the electrode **111*a* is provided on a surface facing the Z1 direction of the conductor 109. The electrode 111*a* is electrically connected to one corresponding interconnect 106 among the plurality of interconnects 106 via the conductor 107, the interconnect 108, and the conductor 109. The electrode 111*a* comes into contact with a corresponding electrode 211*a* of the CMOS circuit chip 20. The electrodes 111*a* and 211*a* function as a bond pad BPa. The bond pad BPa is an active pad. The electrode 111*a* includes copper. Note that the number of interconnects provided between the interconnect 106 and the electrode 111*a*** is optional.

Although not illustrated in FIG. 5, the electrode **111*a* that electrically connects the conductive layer (word line) 103 and the CMOS circuit chip 20 to each other is provided in addition to the electrode 111*a* that electrically connects the interconnect (bit line) 106 and the CMOS circuit chip 20** to each other in the memory cell array area MA.

The insulating layer 113 and the insulating layer 190 are stacked on a surface facing the Z2 direction of the semiconductor layer 101. For example, the insulating layers 113 and 190 include an insulation material such as silicon oxide.

In the memory cell array area MA, the interconnect **191*a* is provided on surfaces facing the Z2 direction of the semiconductor layer 101 and the insulating layer 190. The interconnect 191*a* comes into contact with the semiconductor layer 101 in an opening OPa provided in the insulating layers 113 and 190. The interconnect 191*a* functions as a part of a path (backing interconnect) which electrically connects the semiconductor layer 101 (source line SL) and the CMOS circuit chip 20 to each other. For example, the interconnect 191*a*** includes aluminum (Al).

The insulating layer 192 is provided on surfaces facing the Z2 direction of the insulating layer 190 and the interconnect **191*a*. The insulating layer 193 is provided on a surface facing the Z2 direction of the insulating layer 192. The surface protective layer 198 is provided on a surface facing the Z2 direction of the insulating layer 193. For example, the insulating layer 192 includes silicon oxide. For example, the insulating layer 193 includes an insulation material with low water permeability such as silicon nitride. For example, the surface protective layer 198** includes a resin material such as polyimide.

The insulating layers 192 and 193 and the surface protective layer 198 cover the core region R1, the wall region R2, the outer peripheral region R3, and the kerf region R4 in the array chip 10. However, the insulating layers 192 and 193 and the surface protective layer 198 may be removed from an outer peripheral part of the outer peripheral region R3 and the kerf region R4.

The plane separation area DA of the array chip 10 will be described.

A layer including the semiconductor layer 101 and the insulating layer **121*a* is provided on a surface facing the Z2 direction of the insulating layer 118 in the plane separation area DA. The semiconductor layer 101 includes two semiconductor layers 101*j* and 101*k*. The insulating layer 121*a* is provided between the semiconductor layer 101*j* and the semiconductor layer 101*k*. The semiconductor layer 101*k* is provided on the insulating layer 118. The insulating layer 121*a* is provided on the semiconductor layer 101*k*. The semiconductor layer 101*j* is provided on the insulating layer 121*a*. For example, the insulating layer 121*a* (121) is a stacked film including a silicon oxide layer, a silicon nitride layer, and a silicon oxide layer. In the insulating layer 121**, the silicon nitride layer is provided between two silicon oxide layers.

The semiconductor layers **101*j* and 101*k* and the insulating layer 121*a* in the plane separation area DA are not used as paths that electrically connect the memory cell array 11 to other components. Hereinafter, a layer (structure) including the semiconductor layers 101*j* and 101*k* and the insulating layer 121*a* in the plane separation area DA will be referred to as a dummy layer DM1. However, the semiconductor layers 101*j* and 101*k* can include parts that are continuous with the semiconductor layer 101** as the source line layer BSL.

The insulating layer 113 is provided on a surface facing the Z2 direction of the dummy layer DM1. Note that constituent members including the semiconductor layers **101*j* and 101*k*, the insulating layer 121*a*, and the insulating layer 113** in the plane separation area DA may be referred to as a dummy layer.

The insulating layer 190, the insulating layer 192, the insulating layer 193, and the surface protective layer 198 are stacked in the Z2 direction on a surface facing the Z2 direction of the insulating layer 113. The interconnect 191 may be provided on the insulating layer 190 in the plane separation area DA.

The separation member 90 is provided in the plane separation area DA. For example, the separation member 90 is provided in a slit (opening) S1 formed in the plane separation area DA. The slit S1 is provided in a height of the source line layer BSL, the dummy layer DM1, and the insulating layer 113. The slit S1 is filled with an insulator as the separation member 90. The separation member 90 is adjacent to the source line layer BSL, the dummy layer DM1, and the insulating layer 113 in the Y direction (or the X direction).

The separation member 90 is provided between source line layers BSL in a region (for example, also referred to as a sub-area) between two memory cell array areas MA. Between two adjacent memory cell arrays 11, the insulator as the separation member 90 separates the source line SL in one of the memory cell arrays 11 from the source line SL in the other of the memory cell arrays 11. Between the memory cell array area MA and the contact area CA, the separation member 90 is provided between the source line layer BSL and the dummy layer DM1. The insulator as the separation member 90 separates the source line SL from the dummy layer DM1.

The insulator used in the separation member 90 is a member that is continuous with the insulating layer 190. The insulator as the separation member 90 is a part (projecting portion) which projects from the insulating layer 190 in the Z1 direction. An end on the side of the Z1 direction of the insulator as the separation member 90 comes into contact with the insulating layer 118. Note that the separation member 90 may be a member that is not continuous with the insulating layer 190. The separation member 90 may include an insulation material that differs from the material of the insulating layer 190. There may be cases where an air gap (void) is provided inside the separation member 90.

The separation member 90 separates the source line layer BSL constituted of the semiconductor layer 101 of the memory cell array area MA into parts (memory cell arrays 11) for each plane PLN. The semiconductor layer 101 as the source line layer BSL is independent in a part of each memory cell array 11. Accordingly, a plurality of memory cell arrays 11 respectively corresponding to the plurality of planes PLN are provided in the core region R1.

Details of structures of the separation member 90 and the slit S1 in the plane separation area DA will be provided later.

The contact area CA of the array chip 10 will be described.

The contact area CA includes the semiconductor layer 101 and the insulating layer 121*b*. The semiconductor layer 101 of the contact area CA includes semiconductor layers 101*p* and 101*q*. The insulating layer 121*b* is provided between the two semiconductor layers 101*p* and 101*q*. The semiconductor layer 101*q* is provided on the insulating layer 118. The insulating layer 121*b* is provided on the semiconductor layer 101*q*. The semiconductor layer 101*p* is provided on the insulating layer 121*b*. The semiconductor layers 101*p* and 101*q* of the contact area CA are separated from the semiconductor layers 101*a* and 101*c* in the memory cell array area MA by the plane separation area DA. The semiconductor layers 101*p* and 101*q* do not function as source lines SL (and interconnects).

Hereinafter, a layer (structure) including the semiconductor layers 101*p* and 101*q* and the insulating layer 121*b* will be referred to as a dummy layer DM2. A constituent member further including the insulating layer 113 on the semiconductor layer 101*p* may be referred to as a dummy layer.

The opening OP1 is provided in the dummy layer DM2. In the opening OP1, a side surface of the dummy layer DM2 is covered by a part 91 of the insulating layer 190.

A plurality of conductors (contact plugs CC-1, CC-2, and CC-3) and an interconnect 191*b* are provided in the contact area CA.

The plurality of conductors are provided at a position corresponding to the opening OP1 provided in the dummy layer DM2 and the insulating layer 113. In the example in FIG. 5, three conductors lined up in the Y direction are provided in the contact area CA. The conductors function as the contact plug CC. The contact plug CC has a columnar shape which extends in the Z direction mainly in the insulating layer 118. An end in the Z2 direction of the contact plug CC projects from the insulating layer 118 with respect to the opening OP1. The contact plug CC is used for an electric connection between the interconnect 191*b* and components (for example, a transistor) in the CMOS circuit chip 20. For example, the contact plug CC includes tungsten.

The interconnect 191*b* is electrically connected to the plurality of contact plugs CC-1, CC-2, and CC-3 in the opening OP1. The interconnect 191*b* is electrically insulated from the interconnect 191*a* in the memory cell array area MA. Note that the interconnect 191*b* covers the side surface of the dummy layer DM2 via the part 91 of the insulating layer 190. The interconnect 191*b* extends, via the side surface of the dummy layer DM2, from the contact plug CC to a region above a surface facing the Z2 direction of the dummy layer DM2. The insulating layers 192 and 193 and the surface protective layer 198 are stacked on the interconnect 191*b*. For example, the interconnect 191*b* includes aluminum.

In the contact area CA, a plurality of electrodes (pads) 111*a* and a plurality of electrodes (pads) 111*d* are provided in the insulating layer 119. In the contact area CA, each of the electrodes 111*a* and 111*d* has a rectangular shape as viewed from the Z direction.

The plurality of conductors 105, 107, and 109 and the interconnects 106 and 108 are provided in a region between the contact plug CC and the electrode 111*a* in the insulating layer 118. The conductor (via plug) 105 is provided on an end of the plurality of contact plugs CC on the side of the Z1 direction. The interconnect 106 is provided on an end of the conductor 105 on the side of the Z1 direction. The conductor (via plug) 107 is provided on a surface facing the Z1 direction of the interconnect 106. The interconnect 108 is provided on an end of the conductor 107 on the side of the Z1 direction. The conductor (via plug) 109 is provided between a surface facing the Z1 direction of the interconnect 108 and the electrode 111*a*. Accordingly, the contact plug CC electrically connects the interconnect 191*b* to the corresponding electrode 111*a* via the plurality of conductors 105, 107, and 109 and the plurality of interconnects 106 and 108.

Note that the configurations of the plurality of conductors 105, 107, and 109 and the plurality of interconnects 106 and 108 for connecting the contact plug CC and the electrode 111*a* to each other are not limited to the example in FIG. 5. The numbers of the respective conductors 105, 107, and 109 between the contact plug CC and the electrode 111*a* and the numbers of the respective interconnects 106 and 108 between the contact plug CC and the electrode 111*a* can be appropriately modified.

The electrode 111*a* electrically connects the array chip 10 and the CMOS circuit chip 20 to each other. The electrode

111*a* comes into contact with a corresponding electrode 211*a* of the CMOS circuit chip 20. Accordingly, the bond pad BPa as an active pad is formed in the contact area CA.

The electrode 111*d* comes into contact with a corresponding electrode 211*d* of the CMOS circuit chip 20. The electrodes 111*d* and 211*d* function as a bond pad BPd. The bond pad BPd is a dummy pad. The bond pad BPd is electrically insulated with respect to the memory cell array 11 and various interconnects in the array chip 10 and the semiconductor substrate 201 and various interconnects in the CMOS circuit chip 20.

In the pad area PA between the memory cell array area MA and the contact area CA, the insulating layers 192 and 193 and the surface protective layer 198 have been partially removed. A part of the interconnect 191*b* is exposed via an opening OPz provided in the insulating layers 192 and 193 and the surface protective layer 198. In the opening OPz, the exposed part of the interconnect 191*b* functions as an external connecting terminal (pad 99) of the memory device 1. For example, a bonding wire (not illustrated) is connected to the exposed interconnect 191*b* (pad 99) via the opening OPz. Note that the opening OPz may be provided at a position that overlaps with the opening OP1 in the Z direction.

Details of the structure of the opening OP1 and the structure of the members in the opening OP1 in the contact area CA will be provided later.

<Structure of Wall Region>

The wall region R2 of the array chip 10 will be described. A plurality of wall structures 120 (120-1, 120-2, and 120-3) and various interconnects are provided in the wall region R2 of the array chip 10. The wall structure 120 is connected to the CMOS circuit chip 20 via the various interconnects in the insulating layer 118.

In the example in FIG. 5, the wall structure 120 includes three wall structures 120-1, 120-2, and 120-3. Each of the wall structures 120 extends in the Z direction. As described above, the wall structures 120-1, 120-2, and 120-3 have an approximately rectangular annular shape as viewed from the Z direction. Each of the wall structures 120-1, 120-2, and 120-3 includes a conductor. For example, the wall structures 120-1, 120-2, and 120-3 include tungsten.

A dummy layer DM3 including the semiconductor layers 101*p* and 101*q* and the insulating layer 121*b* is provided in the wall region R2. The insulating layer 121*b* is provided between the two semiconductor layers 101*p* and 101*q*. For example, the dummy layer DM3 is continuous with the dummy layer DM2. However, the dummy layer DM3 may be a member which is provided in a same hierarchical level as the dummy layer DM2 but which is separated from the dummy layer DM2.

A slit (opening) S2 is provided in the dummy layer DM3 and the insulating layer 113 in the wall region R2. In the slit S2, a side surface of the dummy layer DM3 is covered by a part of the insulating layer 190. In the slit S2, an end of the wall structure 120 in the Z2 direction projects from the insulating layer 118. The slit S2 has a sectional structure with a tapered shape as viewed from the X direction. The slit S2 has an approximately rectangular annular shape as viewed from the Z direction. The slit S2 in the wall region R2 is provided in a same hierarchical level as the opening OP1 in the contact area CA.

The interconnect 191*c* is provided in the slit S2. The interconnect 191*c* is connected to an end of the wall structure 120 in the Z2 direction. In the slit S2, since a part of the insulating layer 190 is provided on a side surface of the dummy layer DM3, the interconnect 191*c* does not come into contact with the semiconductor layers 101*p* and 101*q*. The interconnect 191*c* extends, via the side surface of the dummy layer DM3, from the end of the wall structure 120 to a region above a surface facing the Z2 direction of the dummy layer DM3. The interconnect 191*c* is electrically separated from the interconnects 191*a* and 191*b* in the core region R1. For example, the interconnect 191*c* includes aluminum.

The insulating layer 192 covers the interconnect 191*c*. The insulating layer 193 is provided on a surface facing the Z2 direction of the insulating layer 192. The surface protective layer 198 is provided on a surface facing the Z2 direction of the insulating layer 193.

In the wall region R2, a plurality of electrodes 111*a* and a plurality of electrodes 111*d* are provided in the insulating layer 119. The electrode 111*a* comes into contact with a corresponding electrode 211*a*. The electrode 111*d* comes into contact with a corresponding electrode 211*d*. Accordingly, the bond pad BP is formed in the wall region R2.

Among the plurality of wall structures 120, for example, an end of the wall structure 120-1 in the Z1 direction is not connected to the conductor 105. An end of the wall structure 120-2 in the Z1 direction is electrically connected to the electrode 111*a* via the conductor 105, the interconnect 106, the conductor 107, the interconnect 108, and the conductor 109. An end of the wall structure 120-3 in the Z1 direction is electrically connected to the electrode 111*a* via the conductor 105, the interconnect 106, the conductor 107, the interconnect 108, and the conductor 109.

In the wall region R2, each of the plurality of conductors 105, 107, and 109, the plurality of interconnects 106 and 108, and the electrode 111*a* which are electrically connected to the wall structure 120 can have a rectangular annular shape that encloses the core region R1 as viewed from the Z direction.

<Structure of Outer Peripheral Region>

The outer peripheral region R3 of the array chip 10 will be described.

A dummy layer DM4 is provided in the outer peripheral region R3. The dummy layer DM4 includes semiconductor layers 101*m* and 101*n* and the insulating layer 121*c*. The insulating layer 121*c* is provided between the two semiconductor layers 101*m* and 101*n*. The semiconductor layer 101*m* is provided on the insulating layer 118. The insulating layer 121*c* is provided on the semiconductor layer 101*m*. The semiconductor layer 101*n* is provided on the insulating layer 121*c*.

The dummy layer DM4 in the outer peripheral region R3 is provided in a same hierarchical level as the source line layer BSL of the memory cell array 11 and the dummy layers DM1 and DM2 in the core region R1. The semiconductor layers 101*m* and 101*n* provided in the outer peripheral region R3 are electrically separated from the semiconductor layer 101 provided in the same hierarchical level in the core region R1.

A plurality of slits (openings) S3 are provided in the dummy layer DM4 and in the insulating layer 113 on the semiconductor layer 101*n*. An insulator as the embedded member 92 is provided in the slits S3. The insulator as the embedded member 92 has an approximately rectangular annular shape as viewed from the Z direction. The insulator as the embedded member 92 is a member that is continuous with the insulating layer 190. The insulator as the embedded member 92 is a part (projecting portion) which projects from the insulating layer 190 in the Z1 direction. The end of the embedded member 92 in the Z1 direction comes into contact with the insulating layer 118. Note that the embedded member 92 may be a member that is not continuous with the insulating layer 190.

In a manufacturing step of the array chip 10, a discharge plug (not illustrated) including a conductor is embedded in the slits S3. The discharge plug in the slits S3 electrically connect the semiconductor layer 101 to a semiconductor substrate (not illustrated) of the array chip 10 in the manufacturing step of the array chip 10. For example, the semiconductor layer 101 is grounded to the semiconductor substrate via the discharge plug. The discharge plug is used to suppress arcing due to a charge-up of the semiconductor layer 101 during dry etching. The discharge plug is removed after bonding of the two semiconductor chips 10 and 20. A space after the discharge plug has been removed is filled with the insulator as the embedded member 92 described above.

For example, a plurality of electrodes 111*d* are provided in the insulating layer 119 in the outer peripheral region R3 of the array chip 10. The electrode 111*d* comes into contact with the electrode 211*d* of the CMOS circuit chip 20. Accordingly, the bond pad BPd is formed in the outer peripheral region R3.

<Structure of Kerf Region>

The kerf region R4 of the array chip 10 will be described.

The kerf region R4 is an end region of the array chip 10. The kerf region R4 is a region in a dicing area of a wafer.

An alignment mark AM is provided in the kerf region R4. The alignment mark AM is used for alignment between the wafer and a mask during the manufacturing step of the array chip 10 or for alignment during bonding of the array chip 10 and the CMOS circuit chip 20.

The alignment mark AM includes a plurality of insulating layers 102, a plurality of insulating layers 150, the semiconductor layer 101*x*, and the insulating layer 121*x*.

The insulating layer 102 and the insulating layer 150 are provided in a same hierarchical level as the stacked body including the insulating layer 102 and the conductive layer 103 in the memory cell array area MA. The plurality of insulating layers 102 and the plurality of insulating layers 150 are alternately stacked one layer at a time in the Z direction. The semiconductor layer 101*x* is provided between the insulating layer 121*x* and the insulating layer 102 at one end in the Z2 direction. The insulating layer 121*x* includes a stacked body including a silicon oxide layer and a silicon nitride layer. For example, the insulating layer 150 is a silicon nitride layer.

The alignment mark AM includes a part 991 which projects in the Z2 direction. The part 991 of the alignment mark AM which projects in the Z2 direction is provided in openings (groove, slit, step) 999 provided in the semiconductor layer 101*z* and the insulating layer 113. The semiconductor layer 101*z* is provided in a same hierarchical level as the semiconductor layer 101*a* in the memory cell array area MA.

Each of the insulating layer 121*x*, the semiconductor layer 101*x*, and the one or more insulating layers 102 and the one or more insulating layers 150 provided on the surface facing the Z1 direction of the semiconductor layer 101*x* are curved in accordance with the shapes of the openings 999 and project into the openings 999.

The insulating layer 190 is embedded in a space other than a space where the part 991 of the alignment mark AM which projects in the Z2 direction is provided in the openings 999 enclosed by the semiconductor layer 101*z* and the insulating layer 113. The insulating layer 190 covers a side surface of the insulating layer 121*x* in the openings 999. The insulating layer 190 comes into contact with a curved part of the insulating layer 121*x* in the openings 999. The insulating layer 190 opposes a curved part of the semiconductor layer 101*x* via the insulating layer 121*x* in the openings 999.

Note that a structure and constituent members of the alignment mark AM are not limited to the example in FIG. 5. For example, the alignment mark AM may be an insulator with a single-layer structure or a stacked structure.

(1-5-2) Sectional Structure of CMOS Circuit Chip

A sectional structure of the CMOS circuit chip 20 in the memory device 1 according to the present embodiment will be described.

The CMOS circuit chip 20 includes the semiconductor substrate 201. In the CMOS circuit chip 20, a plurality of transistors TR are provided on a surface facing the Z2 direction of the semiconductor substrate 201. The transistors TR are used as components of the row decoder 21, the sense amplifier 22, the voltage generator 23, and the sequencer 24. The transistors TR include the gate insulating layer 202, the gate electrode 203, and a source/drain layer (not illustrated). The gate insulating layer 202 is provided on a surface facing the Z2 direction of the semiconductor substrate 201. The gate electrode 203 is provided on a surface facing the Z2 direction of the gate insulating layer 202. The source/drain layer is provided in the semiconductor substrate 201. For example, in the CMOS circuit chip 20, the transistors TR are not provided in the wall region R2 and the outer peripheral region R3.

In the wall region R2 of the CMOS circuit chip 20, an N-type impurity diffusion layer (for example, an N-type well region) NW and a P-type impurity diffusion layer (for example, a P-type well region) PW are provided in the semiconductor substrate 201.

A plurality of conductors (contact plugs) 204 are provided on a surface facing the Z2 direction of the semiconductor substrate 201. In the core region R1 of the CMOS circuit chip 20, the conductors 204 are respectively provided on the source/drain layer and the gate electrode 203 of the transistors TR. In the wall region R2 of the CMOS circuit chip 20, the conductors 204 are respectively provided on a surface facing the Z2 direction of the N-type impurity diffusion layer NW and a surface facing the Z2 direction of the P-type impurity diffusion layer PW.

The interconnect 205 is provided on a surface facing the Z2 direction of each conductor 204. The conductor (via plug) 206 is provided on a surface facing the Z2 direction of the interconnect 205. The interconnect 207 is provided on a surface facing the Z2 direction of the conductor 206. The conductor (via plug) 208 is provided on a surface facing the Z2 direction of the interconnect 207. The interconnect 209 is provided on a surface facing the Z2 direction of the conductor 208. The conductor (via plug) 210 is provided on a surface facing the Z2 direction of the interconnect 209. In the core region R1, for example, the conductors 204, 206, 208, and 210 have a columnar shape that extends in the Z direction.

In the wall region R2 of the CMOS circuit chip 20, for example, the conductors 204, 206, 208, and 210 and the interconnects 205, 207, and 209 have a rectangular annular shape that encloses the core region R1. The N-type impurity diffusion layer NW and the P-type impurity diffusion layer PW may have a rectangular annular shape. Note that the N-type impurity diffusion layer NW and the P-type impurity diffusion layer PW may be provided so as to have a plurality of parts that are lined up to be separated from each other along the rectangular annular shape so as to enclose the core region R1 of the CMOS circuit chip 20.

The insulating layer 218 is provided on a surface facing the Z2 direction of the semiconductor substrate 201. The insulating layer 218 covers the transistor TR, the conductors 204, 206, 208, and 210, and the interconnects 205, 207, and 209. For example, the insulating layer 218 has a stacked structure (multi-layer interconnect structure) including a plurality of insulating oxide layers and/or a plurality of insulating nitride layers. Note that the number of hierarchical levels of interconnect provided in the CMOS circuit chip 20 is optional.

The insulating layer 219 is provided on a surface facing the Z2 direction of the insulating layer 218. A surface facing the Z2 direction of the insulating layer 219 comes into contact with, for example, a surface facing the Z1 direction of the insulating layer 119. The respective surfaces in contact with each other of the insulating layer 219 and the insulating layer 119 correspond to the bond surface BF between the two semiconductor chips 10 and 20.

The plurality of electrodes (pads) 211*a* and 211*d* are provided in the insulating layer 219. The electrode 211*a* is connected to the electrode 111*a* and the conductor 210. The electrode 211*d* is connected to the electrode 111*d*.

For example, in the core region R1 of the CMOS circuit chip 20, the electrode 211*a* has a rectangular shape as viewed from the Z direction. For example, in the wall region R2 of the CMOS circuit chip 20, the electrode 211*a* that is electrically connected to the wall structure 120-2 can have a rectangular annular shape that encloses the core region R1. The electrode 211*a* that is electrically connected to the wall structure 120-3 can have a rectangular annular shape that encloses the electrode 211*a* that is electrically connected to the wall structure 120-2.

Accordingly, the transistor TR on the semiconductor substrate 201 is electrically connected to the memory cell array 11 of the array chip 10 or the contact plug CC of the array chip 10. The P-type impurity diffusion layer PW is electrically connected to the wall structure 120-2 of the array chip 10. The N-type impurity diffusion layer NW is electrically connected to the wall structure 120-3 of the array chip 10. Alternatively, the wall structure 120-3 may be electrically connected to the P-type impurity diffusion layer PW and the wall structure 120-2 may be electrically connected to the N-type impurity diffusion layer NW. The wall structure 120-1 may be electrically connected to the P-type impurity diffusion layer PW or the N-type impurity diffusion layer NW.

The gate electrode 203, the conductors 204, 206, 208, and 210, the interconnects 205, 207, and 209, and the electrodes 211*a* and 211*d* include, for example, a conductive material such as a metal or a semiconductor. For example, the electrodes 211*a* and 211*d* include copper. For example, the gate insulating layer 202 and the insulating layers 218 and 219 include an insulation material such as silicon oxide.

(1-5-3) Sectional Structure of Bond Pad

Figure 7:
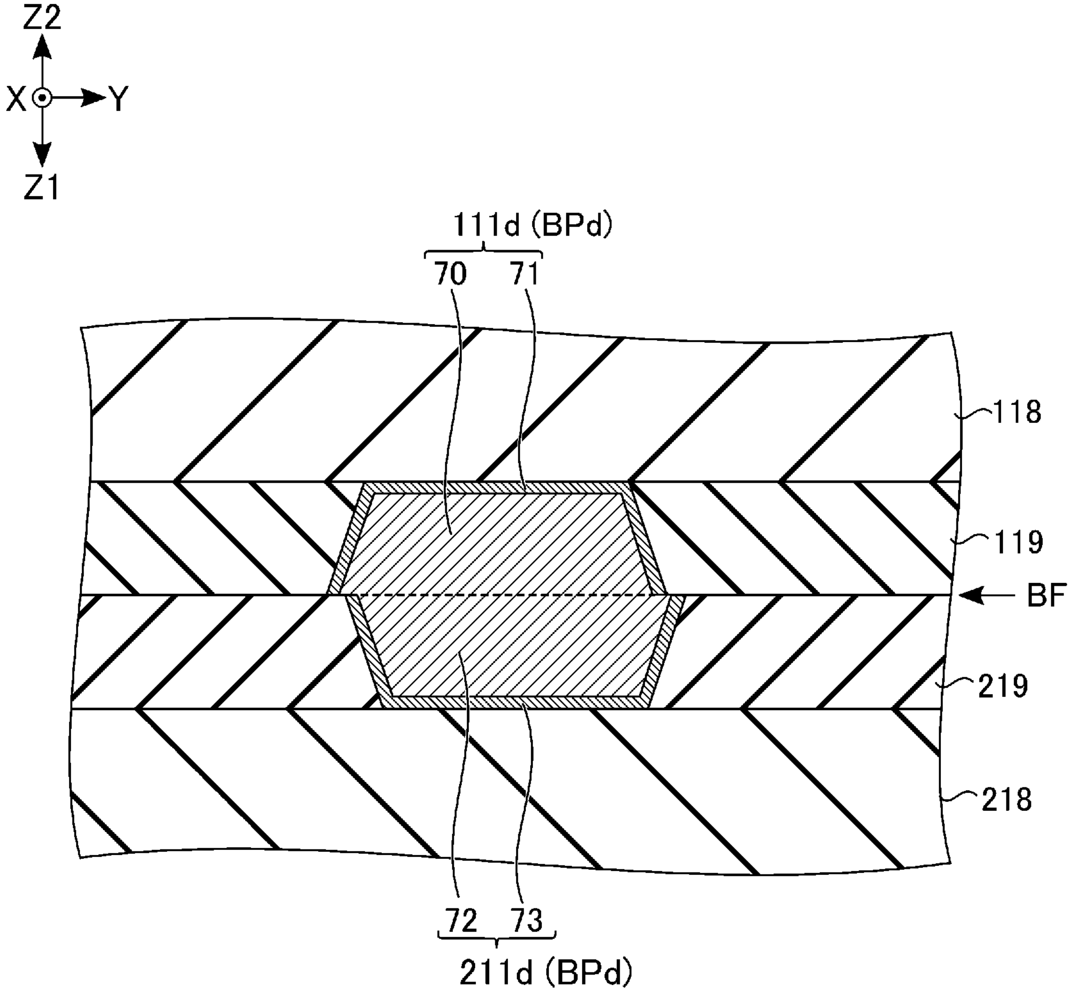
FIG. 7 is a sectional view showing a structure of a bond pad of the memory device according to the embodiment.

A sectional structure of the bond pad BP will be described with reference to FIG. 7. FIG. 7 is a sectional view showing an example of a sectional structure of the bond pad BPd. Note that the following description related to the bond pad BPd can be similarly applied to the bond pad BPa.

As shown in FIG. 7, the electrode 111*d* includes a copper layer 70 and a barrier metal layer 71. The electrode 211*d* includes a copper layer 72 and a barrier metal layer 73.

In a bonding step of the array chip 10 and the CMOS circuit chip 20, the electrode 111*d* is connected to the electrode 211*d*. In the example in FIG. 7, an area of the electrode 111*d* and an area of the electrode 211*d* on the bond surface BF are approximately equal to each other. In such a case, if copper is used in the electrode 111*d* and the electrode 211*d*, the copper layer 70 of the electrode 111*d* and the copper layer 72 of the electrode 211*d* become integrated. As a result, in the two electrodes 111*d* and 211*d*, verifying a boundary of copper of the respective electrode can be difficult. However, bonding of the two semiconductor chips 10 and 20 can be confirmed by a distortion of a bonded shape of the electrode 111*d* and the electrode 211*d* due to a positional displacement of bonding and/or a positional displacement (an occurrence of a discontinuous location on side surfaces) of the barrier metal layers 71 and 73.

In a case where the electrode 111*d* and the electrode 211*d* are respectively formed by a damascene method, side surfaces of the electrodes 111*d* and 211*d* have a tapered shape. Therefore, in a shape of a cross section of the bond pad BP in the Z direction in a part where the electrode 111*d* and the electrode 211*d* are bonded to each other, a side wall (side surface) of the bond pad BP does not assume a linear shape and ends up with a non-rectangular shape.

In a case where the electrode 111*d* and the electrode 211*d* are bonded to each other, a structure is created in which the barrier metal layers 71 and 73 cover bottom surfaces of the copper layers 70 and 72, side surfaces of the copper layers 70 and 72, and upper surfaces of the copper layers 70 and 72 which form the bond pad BP. By comparison, in general interconnect using copper, an insulating layer (SiN, SiCN, or the like) for preventing oxidation of copper is provided on an upper surface of the copper but a barrier metal is not provided on the upper surface of the copper. Therefore, even if a positional displacement of bonding has not occurred, the bond pad BP and general interconnect can be differentiated from each other.

(1-5-4) Sectional Structure of Memory Cell Array

Figure 8:
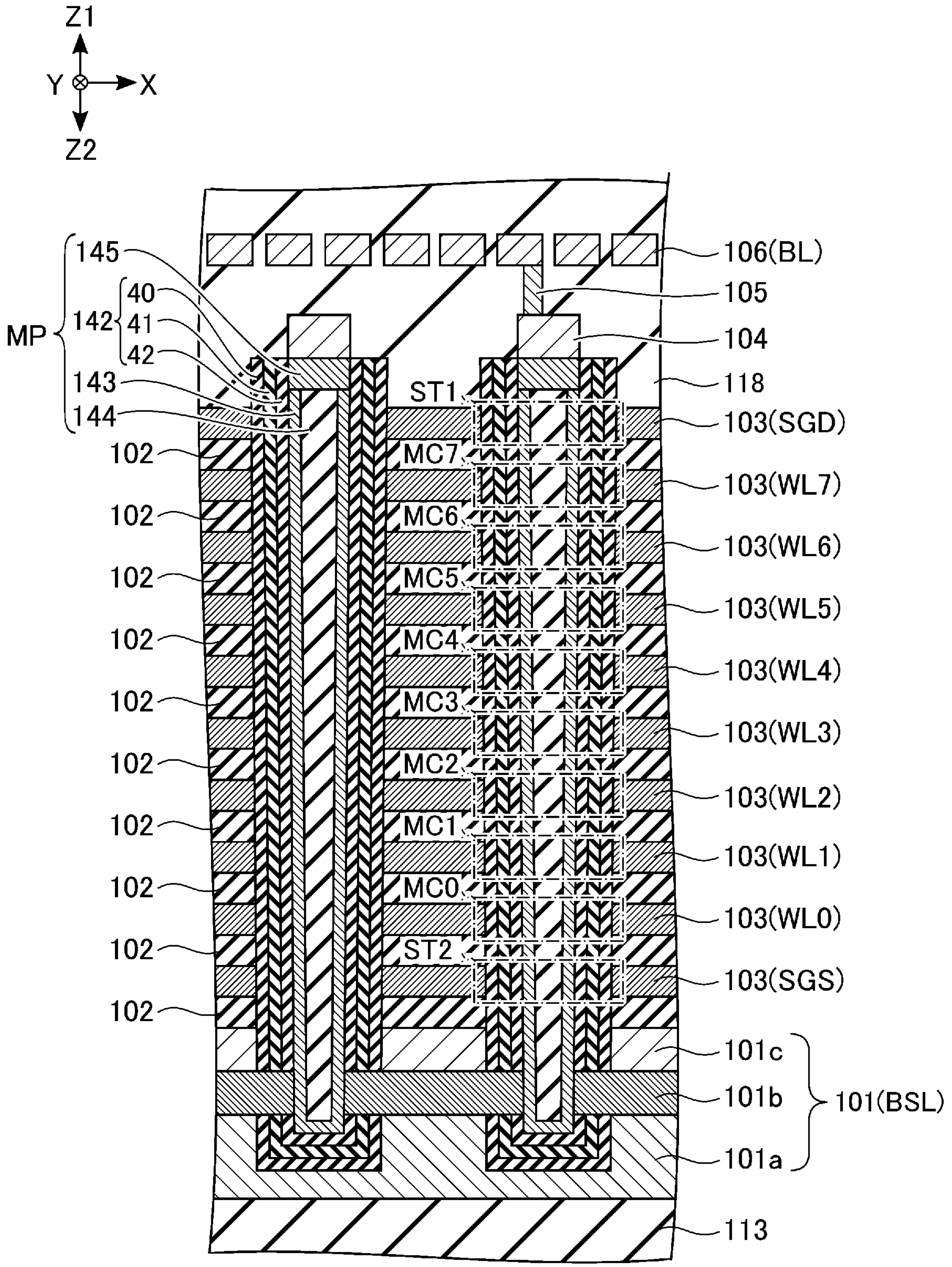
FIG. 8 is a sectional view showing a structure example of the memory cell array of the memory device according to the embodiment.

A sectional structure of the memory cell array 11 will be described with reference to FIG. 8. FIG. 8 is a sectional view showing an example of a sectional structure of the memory cell array 11. FIG. 8 shows two memory pillars MP included in the memory cell array 11.

As shown in FIG. 8, for example, the semiconductor layer 101 includes the three semiconductor layers 101*a*, 101*b*, and 101*c*. The three semiconductor layers 101*a*, 101*b*, and 101*c* function as the source line layer BSL. The semiconductor layer 101*b* is provided on a surface facing the Z1 direction of the semiconductor layer 101*a*. The semiconductor layer 101*c* is provided on a surface facing the Z1 direction of the semiconductor layer 101*b*. For example, the semiconductor layer 101*b* is formed by replacing the insulating layer 121 provided between the semiconductor layer 101*a* and the semiconductor layer 101*c* with a semiconductor material. For example, the semiconductor layers 101*a*, 101*b*, and 101*c* include silicon. For example, the semiconductor layers 101*a*, 101*b*, and 101*c* include phosphorus (P) as a semiconductor impurity.

A plurality of (for example, ten) insulating layers 102 and a plurality of (for example, ten) conductive layers 103 are alternately stacked one layer at a time on a surface facing the Z1 direction of the semiconductor layer 101*c*.

In the example in FIG. 8, each of the ten conductive layers 103 sequentially functions, in order from a side close to the semiconductor layer 101, a select gate line SGS, word lines WL0, WL1, . . . , WL6, and WL7, and a select gate line SGD. Note that each of the select gate lines SGS and SGD may be constituted of a plurality of conductive layers 103.

For example, a stacked structure of titanium nitride (TiN)/tungsten (W) can be used as a conductive material of the conductive layer 103. In this case, the titanium nitride is formed so as to cover the tungsten. The titanium nitride has a function as a barrier layer for suppressing oxidation of tungsten and/or an adhesion layer for improving adhesion of tungsten during formation of the tungsten by, for example, CVD (chemical vapor deposition).

The conductive layers 103 may include a high-dielectric constant material such as aluminum oxide (AlO). In this case, the high-dielectric constant material is formed so as to cover the conductive material.

The insulating layer 118 covers a stacked body including the insulating layers 102 and the conductive layers 103.

The plurality of memory pillars MP are provided in the memory cell array 11. The memory pillars MP that extend in the Z direction penetrate the ten conductive layers 103. A bottom surface of the memory pillars MP reaches the semiconductor layer 101. The memory pillars MP may be structured so that a plurality of pillars are coupled in the Z direction.

An internal configuration of the memory pillars MP will be described. The memory pillars MP include the memory layer 142, the semiconductor layer 143, the core layer 144, and a cap layer 145. The memory layer 142 includes a block insulating layer 40, a charge storage layer 41, and a tunnel insulating layer 42.

A part of a side surface and a surface facing the Z2 direction of the memory pillars MP are sequentially covered, in order from an outer side of the memory pillars MP, by the block insulating layer 40, the charge storage layer 41, and the tunnel insulating layer 42. The block insulating layer 40, the charge storage layer 41, and the tunnel insulating layer 42 on the side surface of the memory pillars MP are removed in a same hierarchical level as the semiconductor layer 101*b* and in a vicinity of the semiconductor layer 101*b*.

The semiconductor layer 143 is provided so as to come into contact with a side surface and a bottom surface of the tunnel insulating layer 42 and with the semiconductor layer 101*b*. The semiconductor layer 143 is a region where a current path (channel) of the memory cell MC and the select transistors ST1 and ST2 are to be formed. The semiconductor layer 143 covers a side surface and a bottom surface of the core layer 144.

The cap layer 145 is provided so as to cover ends on a side of the Z1 direction of the semiconductor layer 143 and the core layer 144 at ends (upper parts) of the memory pillars MP in the Z1 direction. A side surface of the cap layer 145 comes into contact with the tunnel insulating layer 42. For example, the semiconductor layer 143 and the cap layer 145 include silicon.

The conductor 104 is provided on a surface facing the Z1 direction of the cap layer 145. The conductor 105 is provided on a surface facing the Z1 direction of the conductor 104. The conductor 105 is connected to the conductive layer 106 as the bit line BL.

Figure 9:
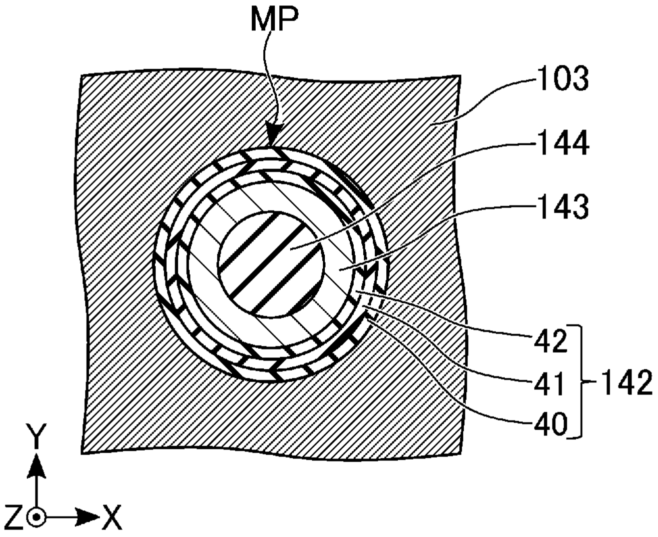
FIG. 9 is a sectional view showing a structure example of a memory pillar of the memory device according to the embodiment.

An example of a sectional structure along the XY plane of the memory pillars MP will be shown with reference to FIG. 9. More specifically, FIG. 9 shows a sectional structure of the memory pillars MP in a hierarchical level including the conductive layer 103.

In a cross section including the conductive layer 103, for example, the core layer 144 is provided in a central part of the memory pillars MP. The semiconductor layer 143 covers a side surface of the core layer 144. The tunnel insulating layer 42 covers a side surface of the semiconductor layer 143. The charge storage layer 41 covers a side surface of the tunnel insulating layer 42. The block insulating layer 40 covers a side surface of the charge storage layer 41. The conductive layer 103 covers a side surface of the block insulating layer 40. Each of the core layer 144, the tunnel insulating layer 42, and the block insulating layer 40 includes silicon oxide. The charge storage layer 41 has a function (property) of storing charges. For example, the charge storage layer 41 includes silicon nitride.

The memory cell MC is constituted of a combination of the memory pillar MP and the conductive layer 103 as the word line WL. The select transistor ST1 is constituted of a combination of the memory pillar MP and the conductive layer 103 as the select gate line SGD. The select transistor ST2 is constituted of a combination of the memory pillar MP and the conductive layer 103 as the select gate line SGS. Accordingly, each memory pillar MP can function as one NAND string NS.

(1-5-5) Structure of Members in Plane Separation Area and Contact Area

An example of structures of constituent members in the plane separation area DA and the contact area CA of the array chip 10 in the memory device 1 according to the present embodiment will be described with reference to FIG. 10.

Figure 10:
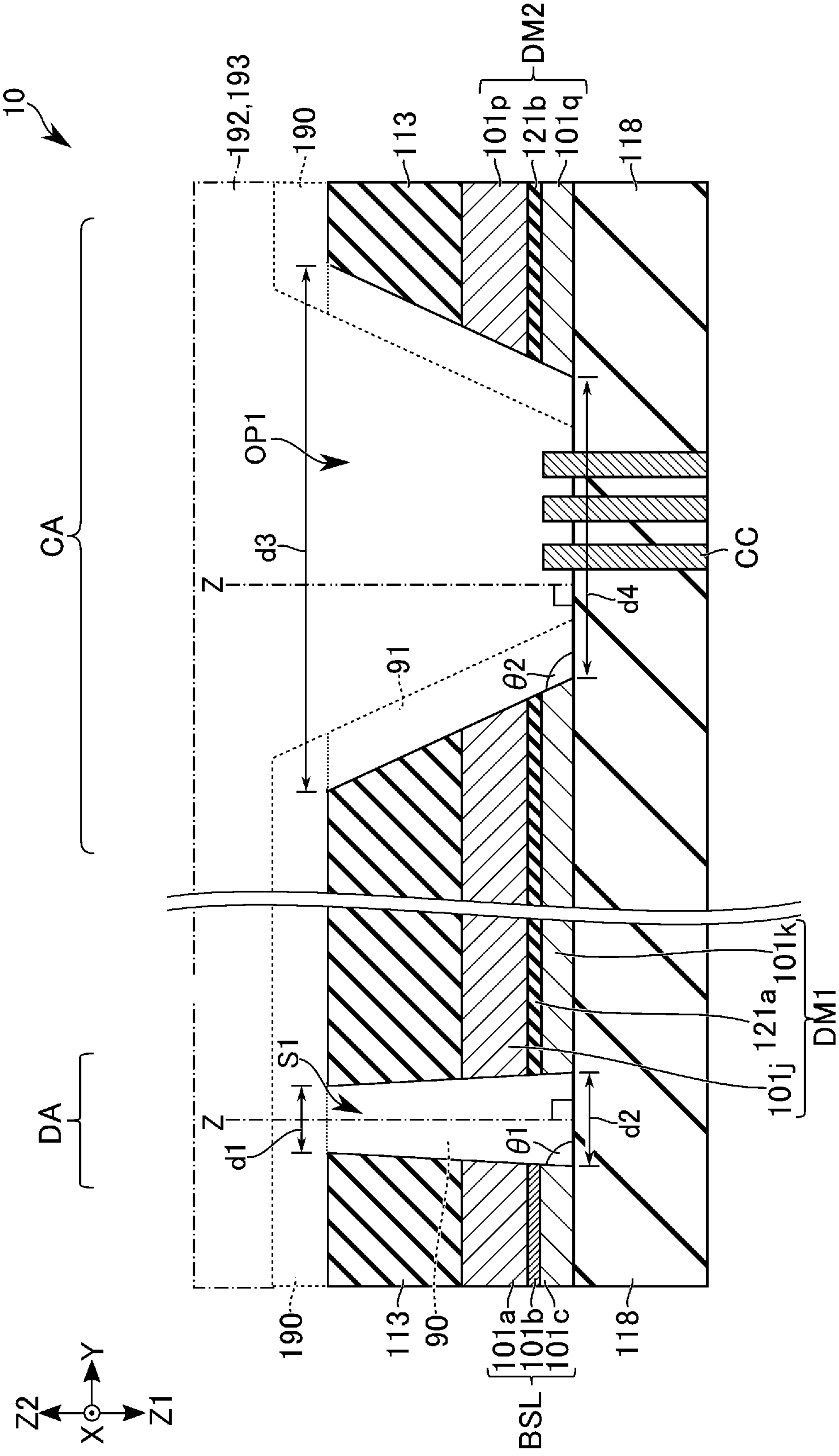
FIG. 10 is a sectional view showing a structure example of each region in the memory device according to the embodiment.

FIG. 10 is a sectional view which extracts and shows the plane separation area DA and the contact area CA.

As shown in FIG. 10, the source line layer BSL and the dummy layer DM1 are provided on a surface facing the Z2 direction of the insulating layer 118 in the plane separation area DA. The dummy layer DM1 is provided in a same hierarchical level as the source line layer BSL of the memory cell array 11 in the Z direction. A height (a position in the Z direction) of the dummy layer DM1 in the Z direction is approximately the same as a height of the source line layer BSL in the Z direction.

The dummy layer DM1 includes the semiconductor layer 101*j*, the insulating layer 121*a*, and the semiconductor layer 101*k*. The semiconductor layer 101*k* is provided on the insulating layer 118. The insulating layer 121*a* is provided on the semiconductor layer 101*k*. The semiconductor layer 101*j* is provided on the insulating layer 121*a*. The insulating layer 121*a* is provided between the semiconductor layer 101*j* and the semiconductor layer 101*k*.

The semiconductor layer 101*j* is constituted of a same material as the semiconductor layer 101*a* of the source line layer BSL. The semiconductor layer 101*k* is constituted of a same material as the semiconductor layer 101*c* of the source line layer BSL. The insulating layer 121*a* is a member to be used as a sacrificial layer for forming a space (air gap) in the source line layer BSL in a forming step of the memory cell array 11.

The slit (opening) S1 is provided between the source line layer BSL and the dummy layer DM1 and in the insulating layer 113. As described above, the slit S1 has a grid-like layout as viewed from a Z direction.

The slit S1 has a sectional structure with a tapered shape as viewed from the X direction (or the Y direction). A dimension on a side of the Z2 direction of the slit S1 with a tapered shape is "d1". A dimension on a side of the Z1 direction of the slit S1 with a tapered shape is "d2". The dimension d1 is smaller than the dimension d2.

Note that the side of the Z2 direction corresponds to a side of the array chip 10, a side of the surface protective layer 198, or an opposite side to a side of the CMOS circuit chip 20. The side of the Z1 direction corresponds to a side of the CMOS circuit chip 20 or a side of the semiconductor substrate 201.

A gradient (incline) is formed on a side surface which faces the slit S1 of the dummy layer DM1 by the slit S1 with a tapered shape. An angle of the gradient (angle of inclination) of the side surface of the dummy layer DM1 is assumed to be an angle between a bottom surface (a surface facing the Z1 direction) of the dummy layer DM1 and the side surface of the dummy layer DM1. The gradient of the side surface of the dummy layer DM1 is an obtuse angle (an angle greater than 90 degrees).

An angle θ1 is formed between the side surface of the dummy layer DM1 (or the source line layer BSL) and a part parallel to the Y direction on a side of the CMOS circuit chip 20 (for example, an upper part which faces the Z2 direction of the insulating layer 118) in the slit S1. The angle θ1 corresponds to a taper angle of the separation member 90 (and the slit S1). The angle θ1 is formed between a side surface of the separation member 90 (or a side surface of the slit S1) and a part along a direction (in this case, the Y direction) parallel to a surface of the substrate on the side of the CMOS circuit chip 20 (or a bottom surface of the slit S1). The angle θ1 can also be described as an angle formed between the side surface of the separation member 90 provided in the slit S1 and the bottom surface of the separation member 90. The angle θ1 is smaller than 90 degrees. The angle θ1 is an acute angle. However, the angle θ1 may be 90 degrees.

An insulator as the separation member 90 is provided in the slit S1. The insulator as the separation member 90 is, for example, a part (projecting portion) which projects from the insulating layer 190 towards the CMOS circuit chip 20. The separation member 90 has a tapered shape in accordance with the shape of the slit S1. In the slit S1, the separation member 90 comes into contact with the side surface of the dummy layer DM1. A bottom part of the separation member 90 comes into contact with the insulating layer 118.

Note that in FIG. 5, a configuration of the plane separation area DA at a boundary between the memory cell array area MA and the contact area CA is shown. However, as described above, the plane separation area DA is also provided between two memory cell array areas MA. In this case, the separation member 90 is provided between two source line layers BSL. In addition, FIG. 5 shows an example in which the semiconductor layer 101*b* extends from a part in contact with the insulator 170 to a part in contact with the separation member (insulator) 90 in the source line layer BSL in the memory cell array area MA. However, there may be cases where the insulating layer 121 remains between the semiconductor layer 101*a* and the semiconductor layer 101*c* in the source line layer BSL in a region in a vicinity of the separation member 90 without the insulating layer 121 being replaced with the semiconductor layer 101*b*.

The dummy layer DM2 is provided on a surface facing the Z2 direction of the insulating layer 118 in the contact area CA. The dummy layer DM2 is provided in a same hierarchical level as the source line layer BSL of the memory cell array 11 and the dummy layer DM1 of the plane separation area DA in the Z direction. A height of the dummy layer DM2 in the Z direction is approximately the same as a height of the dummy layer DM1 and a height of the source line layer BSL in the Z direction.

The dummy layer DM2 includes the semiconductor layer 101*p*, the insulating layer 121*b*, and the semiconductor layer 101*q*. The semiconductor layer 101*q* is provided on the insulating layer 118. The insulating layer 121*b* is provided on the semiconductor layer 101*q*. The semiconductor layer 101*p* is provided on the insulating layer 121*b*. The insulating layer 121*b* is provided between the semiconductor layer 101*p* and the semiconductor layer 101*q*. The semiconductor layer 101*p* includes a same material as the semiconductor layers 101*j* and 101*a*. The insulating layer 121*b* includes a same material as the insulating layer 121*a*. The semiconductor layer 101*q* includes a same material as the semiconductor layers 101*c* and 101*k*.

The opening OP1 is provided in the dummy layer DM2 in a region corresponding to a plug arrangement portion of the contact area CA. The contact plug CC extends from the opening OP1 in the Z1 direction and is also provided in a region of the insulating layer 118 facing the opening OP1. An end in the Z2 direction of the contact plug CC is exposed from the dummy layer DM2 in the opening OP1.

The opening OP1 has a rectangular shape as viewed from the Z direction. The opening OP1 has a tapered shape as viewed from the X direction (or the Y direction). A dimension on a side of the Z2 direction of the opening OP1 with a tapered shape is "d3". A dimension on a side of the Z1 direction of the opening OP1 with a tapered shape is "d4". The dimension d3 is larger than the dimension d4.

For example, the dimension d3 is larger than the dimensions d1 and d2. For example, the dimension d4 is larger than the dimensions d1 and d2. As a magnitude relationship of the dimensions d1, d2, d3, and d4, the plurality of dimensions d1, d2, d3, and d4 have a relationship expressed as "d3>d4>d2>d1". Note that the dimensions d1 and d3 can be substituted by respective dimensions of the slit S1 and the opening OP1 at a position of a surface on the side of the Z2 direction of the source line layer BSL (and each dummy layer DM).

Due to the opening OP1 with a tapered shape, a gradient is formed on a side surface which faces the opening OP1 of the dummy layer DM2. An angle of the gradient of the side surface of the dummy layer DM2 is assumed to be an angle between a bottom surface (a surface facing the Z1 direction) of the dummy layer DM2 and the side surface of the dummy layer DM2. The gradient of the side surface of the dummy layer DM2 is an acute angle (an angle smaller than 90 degrees).

An angle θ2 is formed between the side surface of the dummy layer DM2 and a part parallel to the Y direction on a side of the CMOS circuit chip 20 (for example, an upper part which faces the Z2 direction of the insulating layer 118) in the opening OP1. The angle θ2 corresponds to a taper angle of the opening OP1. For example, the angle θ2 of the opening OP1 is formed between the side surface of the dummy layer DM2 (or a side surface of the opening OP1) and a surface on a side of the Z2 direction of the insulating layer 118 (an upper part of the insulating layer 118, or a bottom surface of the opening OP1). The angle θ2 is greater than 90 degrees. The angle θ2 is an obtuse angle.

As described above, the insulating layer 190, the interconnect 191*b*, and the insulating layer 192 are provided in the opening OP1. An inside of the opening OP1 is embedded with a member (structure) which includes the insulating layer 190 and the interconnect (conductive layer) 191*b*. The part 91 of the insulating layer 190 covers the dummy layer DM2 in the opening OP1 and is in contact with the side surface of the dummy layer DM2. In regards to the insulating layer 190, the part 91 in the opening OP1 is inclined with respect to the Z direction in accordance with a gradient of the side surface of the dummy layer DM2.

In the memory device 1 according to the present embodiment, the tapered shape of the slit S1 in the plane separation area DA differs from the tapered shape of the opening OP1 in the contact area CA. Accordingly, a gradient of the side surface of the dummy layer DM1 in the plane separation area DA differs from a gradient of the side surface of the dummy layer DM2 in the contact area CA.

In a case where the separation member 90 (and the slit S1) has a tapered shape, a dimension d1 in the Y direction on a side of the Z2 direction (a side of the array chip 10, a side of the surface protective layer 198) of the separation member 90 is smaller than a dimension d2 in the Y direction on a side of the Z1 direction (a side of the CMOS circuit chip 20) of the separation member 90. On the other hand, in regards to the tapered shape of the opening OP1, a dimension d3 in the Y direction on a side of the Z2 direction (a side of the array chip 10, a side of the surface protective layer 198) of the opening OP1 is larger than a dimension d4 in the Y direction on a side of the Z1 direction (a side of the CMOS circuit chip 20) of the opening OP1.

In this manner, in the present embodiment, the slit S1 and the opening OP1 have taper directions that are opposite to each other.

Hereinafter, a tapered shape in which the dimension d3 along the XY plane on the side of the Z2 direction is greater than the dimension d4 along the XY plane on the side of the Z1 direction as in the case of the tapered shape of the opening OP1 will be referred to as a forward tapered shape. A tapered shape in which the dimension d1 along the XY plane on the side of the Z2 direction is smaller than the dimension d2 along the XY plane on the side of the Z1 direction as in the case of the tapered shape of the separation member 90 (and the slit S1) will be referred to as an inverse tapered shape. Note that in a case where the angle of the side surfaces of the separation member 90 and the slit S1 is 90 degrees, the sectional shapes of the separation member 90 and the slit S1 are non-tapered shapes.

In the present embodiment, an angle (for example, the taper angle of the slit S1) θ1 formed by the side surface of the dummy layer DM1 in the slit S1 and a part parallel to the Y direction on the side of the CMOS circuit chip 20 (for example, a part of a surface facing the Z2 direction of the insulating layer 118) differs from an angle (for example, the taper angle of the opening OP1) θ2 formed by the side surface of the dummy layer DM2 in the opening OP1 and a part parallel to the Y direction on the side of the CMOS circuit chip 20. The angle θ1 is an acute angle or a right angle. The angle θ2 is an obtuse angle. The angle θ1 is closer to 90 degrees (a right angle) than the angle θ2.

As shown in FIG. 5, the slit S2 is provided in the wall region R2. The slit S2 has a forward tapered shape in a similar manner to the opening OP1. The slit S2 is provided in the dummy layer DM3. A height of the dummy layer DM3 in the Z direction is approximately the same as a height of the source line layer BSL in the Z direction. The slit S2 is filled with the insulating layer 190 and the conductive layer 191*c*. A dimension in the Y direction on the side of the Z2 direction of the slit S2 is larger than a dimension in the Y direction on the side of the Z1 direction of the slit S2. For example, in the slit S2, an angle formed between the side surface of the dummy layer DM3 and a part parallel to the Y direction on the side of the CMOS circuit chip 20 is substantially equal to the angle θ2. The slit S2 is concurrently formed with the opening OP1 by, for example, a common manufacturing step.

In addition, as shown in FIG. 5, the slit S3 is provided in the outer peripheral region R3. The slit S3 has an inverse tapered shape or a non-tapered shape in a similar manner to the slit S1. The slit S3 is provided in the dummy layer DM4. A height of the dummy layer DM4 in the Z direction is approximately the same as a height of the source line layer BSL in the Z direction. The slit S3 is filled with an insulator as the embedded member 92. The embedded member 92 has an inverse tapered shape or a non-tapered shape in a similar manner to the separation member 90. A dimension in the Y direction on the side of the Z2 direction of the embedded member 92 (and the slit S3) is equal to or smaller than a dimension in the Y direction on the side of the Z1 direction of the embedded member 92 (and the slit S3). For example, in the slit S3, an angle formed between the side surface of the dummy layer DM4 and a part parallel to the Y direction on the side of the CMOS circuit chip 20 is substantially equal to the angle (for example, a taper angle) θ1. The slit S3 is concurrently formed with the slit S1 by, for example, a common manufacturing step.

As shown in FIG. 5, an opening OPz which exposes the interconnect 191*b* in the pad area PA between the memory cell array area MA and the contact area CA has a forward tapered shape. A dimension in the Y direction (or the X direction) on the side of the Z2 direction of the opening OPz is larger than a dimension in the Y direction (or the X direction) on the side of the Z1 direction of the opening OPz. The opening OPz is provided in the insulating layers 192 and 193 and the surface protective layer 198 in the pad area PA. An opening surface on the side of the Z2 direction of the opening OPz is positioned on a side of the surface protective layer 198 (the side of the Z2 direction) than opening surfaces on the side of the Z2 direction of the slit S1 and the opening OP1.

In the memory cell array area MA, an opening OPa in which the interconnect 191*a* is provided has a forward tapered shape. A dimension in the Y direction (or the X direction) on the side of the Z2 direction of the opening OPa is larger than a dimension in the Y direction (or the X direction) on the side of the Z1 direction of the opening OPa. The opening OPa is provided in the insulating layers 113 and 190 in the memory cell array area MA. An end on the side of the Z1 direction of the opening OPa in which the interconnect 191*a* is provided is positioned on a side of the surface protective layer 198 than an end on the side of the Z1 direction of the slit S1 and the opening OP1.

As shown in FIG. 5, in the memory cell array area MA, the insulator 170 and the slit SLT have an inverse tapered shape in a similar manner to the separation member 90 and the slit S1. However, ends on the side of the Z2 direction of the insulator 170 and the slit SLT are positioned lower in the Z direction (on the side of the CMOS circuit chip 20) than the ends on the side of the Z2 direction of the separation member 90 and the slit S1. The ends on the side of the Z2 direction of the insulator 170 and the slit SLT are positioned on the side of the Z1 direction than a surface facing the Z1 direction of the semiconductor layer 101*a*. In addition, ends on the side of the Z1 direction of the insulator 170 and the slit SLT are positioned lower in the Z direction (on the side of the CMOS circuit chip 20) than the ends on the side of the Z1 direction of the separation member 90 and the slit S1. The insulator 170 does not divide the source line layer BSL into a plurality of parts.

As described above, the memory device 1 according to the present embodiment includes the dummy layer DM1 including the slit S1 with an inverse tapered shape or a non-tapered shape in the plane separation area DA and the dummy layer DM2 including the opening OP1 with a forward tapered shape in the contact area CA.

In the present embodiment, the angle θ1 of the slit S1 in the plane separation area DA is an acute angle closer to 90 degrees than the angle θ2 of the opening OP1 or a right angle. Accordingly, the memory device 1 according to the present embodiment can reduce an area of a region for dividing the memory cell array 11 for each plane PNL. In addition, the memory device 1 according to the present embodiment can improve an occlusion of the slit S1 by an insulator as the separation member 90.

In the present embodiment, the angle θ2 of the opening OP1 with a forward tapered shape is an obtuse angle that is more separated from 90 degrees than the angle θ1. Accordingly, the conductive layer 191*b* including aluminum can be provided with a relatively thick film thickness on the side wall of the opening OP1 (the side surface of the dummy layer DM2). As a result, the memory device 1 according to the present embodiment can suppress an effect of electromigration in the conductive layer 191*b* on the side wall of the opening OP1.

(2) Manufacturing Method

A method of manufacturing the memory device according to the embodiment will be described with reference to FIGS. 11 to 21.

(2-1) Method of Manufacturing Array Chip

An example of a method of manufacturing the array chip 10 in the memory device 1 according to the present embodiment will be described with reference to FIGS. 11 to 16. FIGS. 11 to 16 are sectional views showing an example of a manufacturing step of the array chip 10.

Figure 11:
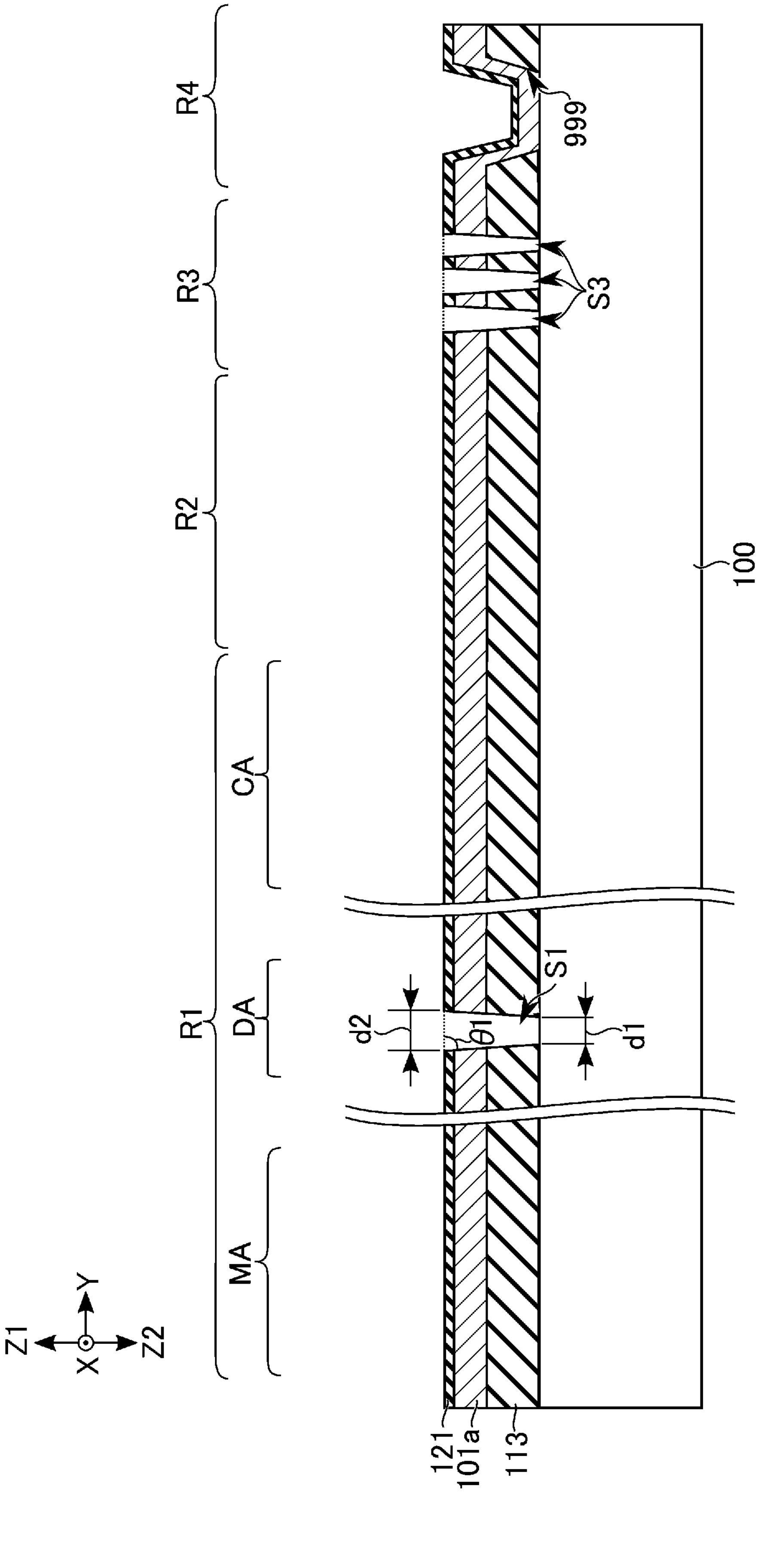
FIG. 11 is a sectional step chart showing a step of a method of manufacturing the memory device according to the embodiment.

As shown in FIG. 11, the insulating layer 113 is formed on a semiconductor substrate (wafer) 100 of the array chip 10. In the kerf region R4 in a dicing area of the wafer, the insulating layer 113 is processed by photolithography and etching. Accordingly, the opening (groove, slit, step) 999 is formed in the insulating layer 113 at a location corresponding to an alignment mark of the kerf region R4. In the kerf region R4, an upper surface (a surface facing the Z1 direction) of the semiconductor substrate 100 is exposed via the opening 999.

The semiconductor layer 101*a* is formed on the insulating layer 113. The semiconductor layer 101*a* comes into contact with the semiconductor substrate 100 via the opening 999 in a part corresponding to the alignment mark (hereinafter, referred to as an alignment mark portion).

The insulating layer 121 is formed on the semiconductor layer 101*a*. For example, the insulating layer 121 includes three layers. In the insulating layer 121 including three layers, a silicon oxide layer is formed on the semiconductor layer 101*a*. A silicon nitride layer is formed on the silicon oxide layer. A silicon oxide layer is formed on the silicon nitride layer.

In the alignment mark portion, the semiconductor layer 101*a* and the insulating layer 121 are recessed toward the side of the semiconductor substrate 100 in accordance with the opening 999 formed in the insulating layer 113. In other words, the semiconductor layer 101*a* and the insulating layer 121 are formed so as to have a shape that projects toward the side of the Z2 direction in the opening 999.

In the plane separation area DA and the outer peripheral region R3, the insulating layer 113, the semiconductor layer 101*a*, and the insulating layer 121 are processed in a predetermined shape by photolithography and etching.

Accordingly, the slit S1 is formed in the plane separation area DA. The slit S1 has a grid-like layout as viewed from a Z direction. A plurality of (for example, three) slits S3 are formed in the outer peripheral region R3. Each slit S3 has an approximately rectangular annular layout as viewed from a Z direction. A surface facing the Z1 direction of the semiconductor substrate 100 is exposed via the slits S1 and S3.

The slits S1 and S3 have a tapered sectional shape as viewed from the X direction (or the Y direction). The slits S1 and S3 are formed by etching from the side of the Z1 direction (side of the insulating layer 121) toward the side of the Z2 direction (side of the semiconductor substrate 100). Therefore, a dimension d2 in the Y direction on the side of the Z1 direction of the slit S1 (and the slit S3) is larger than a dimension d1 in the Y direction on the side of the Z2 direction of the slit S1.

Etching for forming the slits S1 and S3 is executed at a relatively high etching rate. Therefore, a taper angle of each of the slits S1 and S3 is close to 90 degrees. At this time point, the angle θ1 of a side surface of the slit S1 (or the slit S3) is assumed to be an angle formed between an opening surface (a part parallel to the XY plane on the side of the Z1 direction) of the slit S1 and a side surface of the insulating layer 121.

For example, the slits S1 and S3 may have non-tapered shapes. In such a case, side surfaces of the slits S1 and S3 have an angle of 90 degrees with respect to the XY plane.

Figure 12:
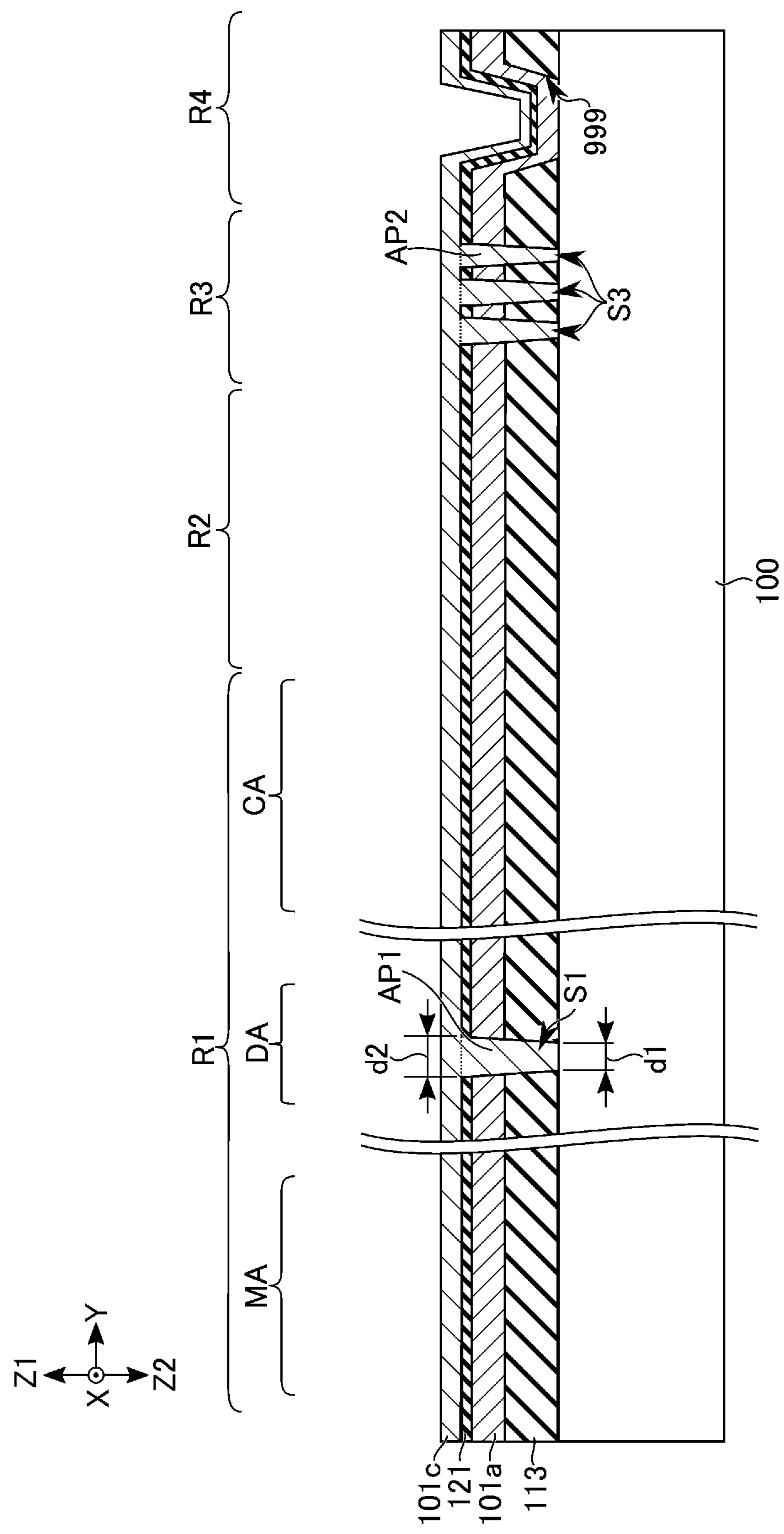
FIG. 12 is a sectional step chart showing a step of the method of manufacturing the memory device according to the embodiment.

As shown in FIG. 12, the semiconductor layer 101*c* is formed on the insulating layer 121 and in the slits S1 and S3. In the plane separation area DA, the inside of the slit S1 is filled with the semiconductor layer 101*c*. In the outer peripheral region R3, the inside of the slit S3 is filled with the semiconductor layer 101*c*. The semiconductor layer 101*c* in the slits S1 and S3 comes into contact with the semiconductor layer 101*a* and the semiconductor substrate 100. The semiconductor layer 101*c* is electrically connected to the semiconductor substrate 100. The semiconductor layer 101*a* is electrically connected to the semiconductor substrate 100 via the semiconductor layer 101*c*.

The semiconductor layer 101*c* in the slits S1 and S3 functions as discharge plugs AP1 and AP2 with respect to charging of the semiconductor layer 101 in a reactive ion etching step to be described later.

Figure 13:
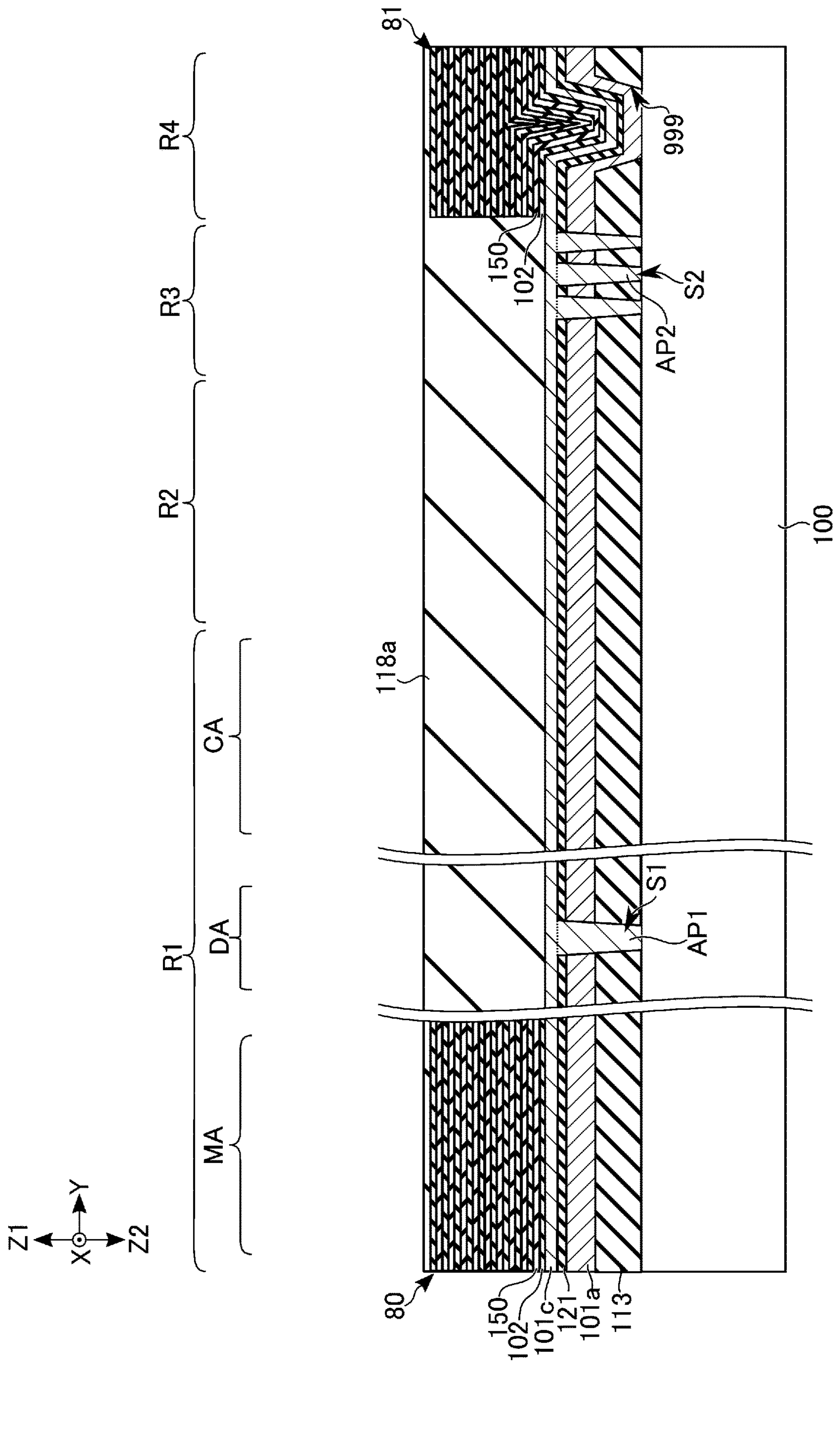
FIG. 13 is a sectional step chart showing a step of the method of manufacturing the memory device according to the embodiment.

As shown in FIG. 13, a plurality of insulating layers 102 and a plurality of sacrificial layers 150 are formed on the semiconductor layer 101*c*. The plurality of insulating layers (for example, silicon oxide layers) 102 and the plurality of sacrificial layers 150 are alternately stacked one layer at a time. The sacrificial layers 150 are to be replaced with conductive layers (interconnects) 103 in a step to be described later. For example, silicon nitride is used in the sacrificial layers 150.

The plurality of insulating layers 102 and the plurality of sacrificial layers 150 are selectively removed from inside the plane separation area DA, inside the contact area CA, inside the pad area (not illustrated), inside the wall region R2, and inside the outer peripheral region R3.

Accordingly, stacked bodies 80 and 81 including the plurality of insulating layers 102 and the plurality of sacrificial layers 150 respectively remain in the memory cell array area MA and the kerf region R4. In the kerf region R4, the one or more insulating layers 102 and the one or more sacrificial layers 150 of the stacked body 81 have a shape that projects toward the side of the Z2 direction in accordance with a depression (projected shape) of the semiconductor layer 101*a* and the insulating layer 121 formed in the opening 999.

In the memory cell array area MA, the plurality of insulating layers 102 and the plurality of sacrificial layers 150 are processed so that an end of the stacked body 80 has a stair shape in a part (region) that is not illustrated.

Subsequently, an insulating layer 118*a* is formed on the stacked bodies 80 and 81 and the semiconductor layer 101*c*.

Figure 14:
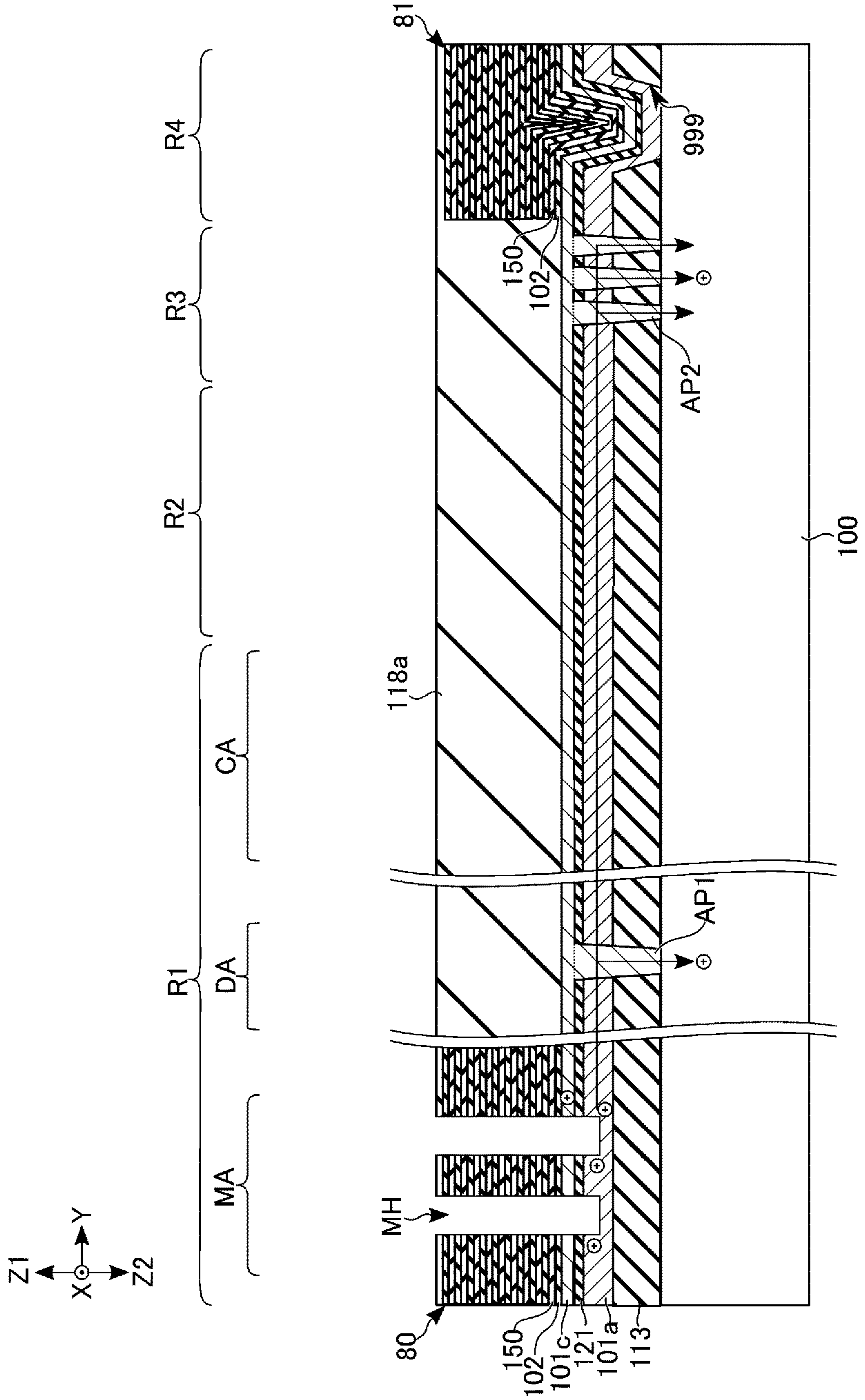
FIG. 14 is a sectional step chart showing a step of the method of manufacturing the memory device according to the embodiment.

As shown in FIG. 14, a memory hole MH is formed in the stacked body 80 in the memory cell array area MA. The memory hole MH penetrates the sacrificial layer 150, the insulating layer 102, the semiconductor layer 101*c*, and the insulating layer 121. A bottom surface of the memory hole MH reaches inside of the semiconductor layer 101*a*.

The memory hole MH is formed by reactive ion etching with respect to the stacked body 80. Therefore, in a case where the semiconductor layer 101 is in a floating state, charge is accumulated in the semiconductor layer 101.

In the present embodiment, the semiconductor layer 101*c* which is embedded in the slit S1 in the plane separation area DA and in the slit S3 in the outer peripheral region R3 functions as the discharge plugs AP1 and AP2. The semiconductor layer 101*c* is electrically connected (for example, grounded) to the semiconductor substrate 100. The semiconductor layer 101*a* is electrically connected to the semiconductor substrate 100 via the semiconductor layer 101*c*.

As a result, a charge generated by reactive ion etching is released from the semiconductor layer 101 to the semiconductor substrate 100 via the semiconductor layer 101*c* as the discharge plugs AP1 and AP2.

Accordingly, arcing attributable to charging of the semiconductor layer 101 is prevented.

Figure 15:
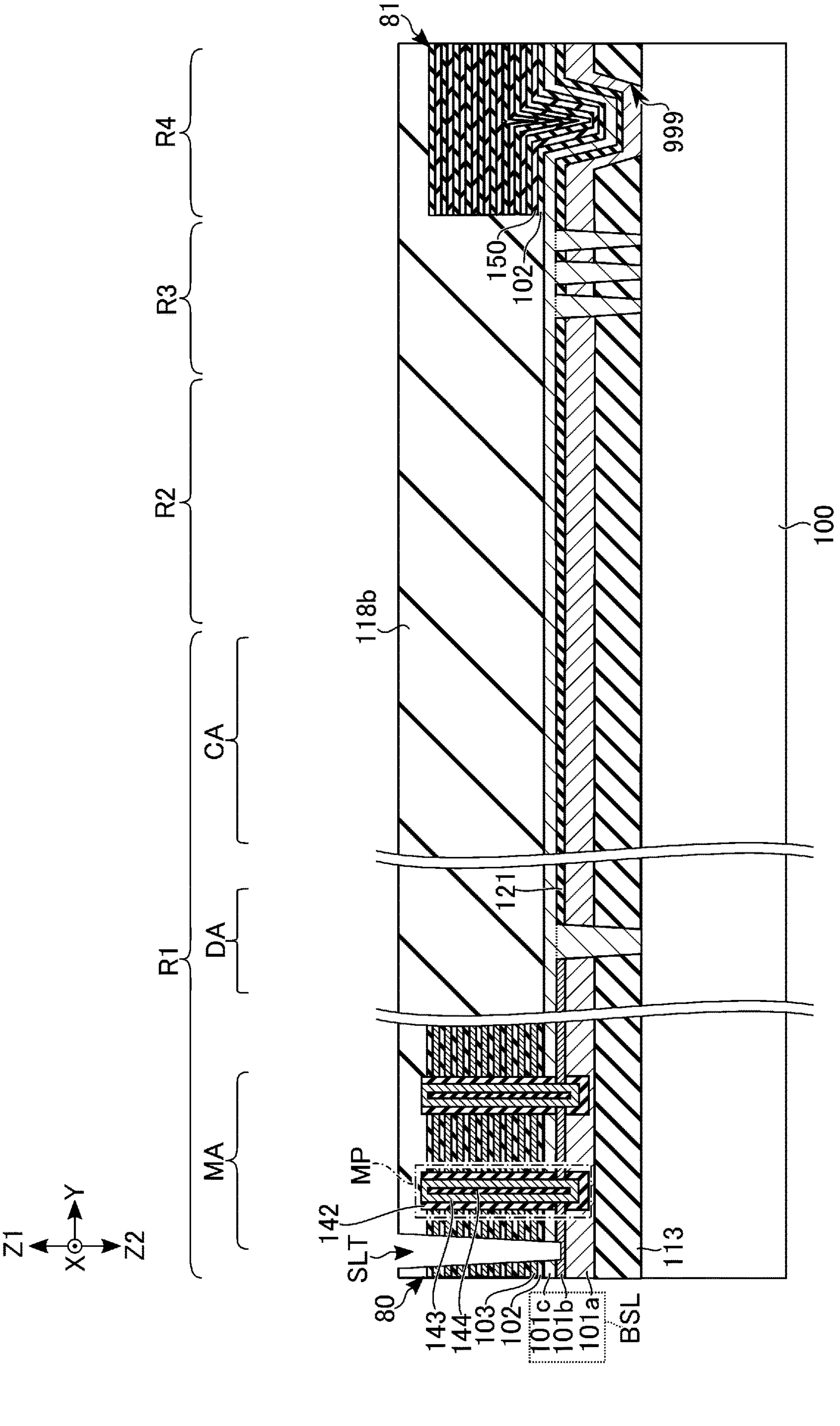
FIG. 15 is a sectional step chart showing a step of the method of manufacturing the memory device according to the embodiment.

As shown in FIG. 15, a memory pillar MP is formed in the stacked body 80 in the memory cell array area MA.

The memory layer 142, the semiconductor layer 143, and the core layer 144 shown in FIGS. 8 and 9 are sequentially formed on an upper surface of the stacked body 80 and on a side surface of the stacked body 80 in the memory hole MH. The memory layer 142 includes the block insulating layer 40, the charge storage layer 41, and the tunnel insulating layer 42. The memory hole MH is embedded by the memory layer 142, the semiconductor layer 143, and the core layer 144.

A part of the semiconductor layer 143 and a part of the core layer 144 are removed from an end (upper part) facing the Z1 direction of the memory pillar MP. A cap layer (not illustrated) is formed on the upper part of the memory pillar MP.

The memory layer 142, the semiconductor layer 143, the core layer 144, and the cap layer on surfaces (upper surfaces) facing the Z1 direction of the stacked bodies 80 and 81 and the insulating layer 118*a* are removed. An insulating layer is formed on the upper part of the memory pillar MP, and on upper surfaces of the stacked bodies 80 and 81 and the insulating layer 118*a*. Accordingly, an insulating layer 118*b* is formed on the semiconductor substrate 100.

In the memory cell array area MA, the insulating layer 121 between the semiconductor layers 101*a* and 101*c* is replaced with the semiconductor layer 101*b*. In the replacement processing from the insulating layer 121 to the semiconductor layer 101*b*, for example, a slit SLT is formed in a given region of the memory cell array area MA. A dimension in the Y direction on the side of the Z1 direction of the slit SLT is larger than a dimension in the Y direction on the side of the Z2 direction of the slit SLT. The slit SLT penetrates the insulating layer 118*b*, the stacked body 80, and the semiconductor layer 101*c*. A bottom surface of the slit SLT reaches inside the insulating layer 121. The slit SLT does not divide the semiconductor layer 101*a* into a plurality of parts.

For example, the insulating layer 121 is selectively removed from inside the memory cell array area MA via the slit SLT by wet etching. The memory layer 142 is removed by wet etching via a space from which the insulating layer 121 has been removed. A side surface of the semiconductor layer 143 of the memory pillar MP is exposed with respect to a space between the semiconductor layer 101*a* and the semiconductor layer 101*c*. The semiconductor layer 101*b* is formed in a space from which the insulating layer 121 and the memory layer 142 have been removed. Accordingly, the semiconductor layer 143 of the memory pillar MP is connected to the semiconductor layer 101*b*.

A set of the semiconductor layers 101*a*, 101*b*, and 101*c* functions as the source line layer BSL.

The sacrificial layer 150 in the stacked body 80 is replaced with the conductive layer 103. For example, the sacrificial layer 150 is selectively removed from inside the stacked body 80 via the slit SLT by wet etching. Accordingly, a space is formed between the insulating layers 102 in the stacked body 80. The conductive layer 103 is formed in a space from which the sacrificial layer 150 has been removed. In this manner, the conductive layer 103 is formed between the insulating layers 102 in the stacked body 80.

Figure 16:
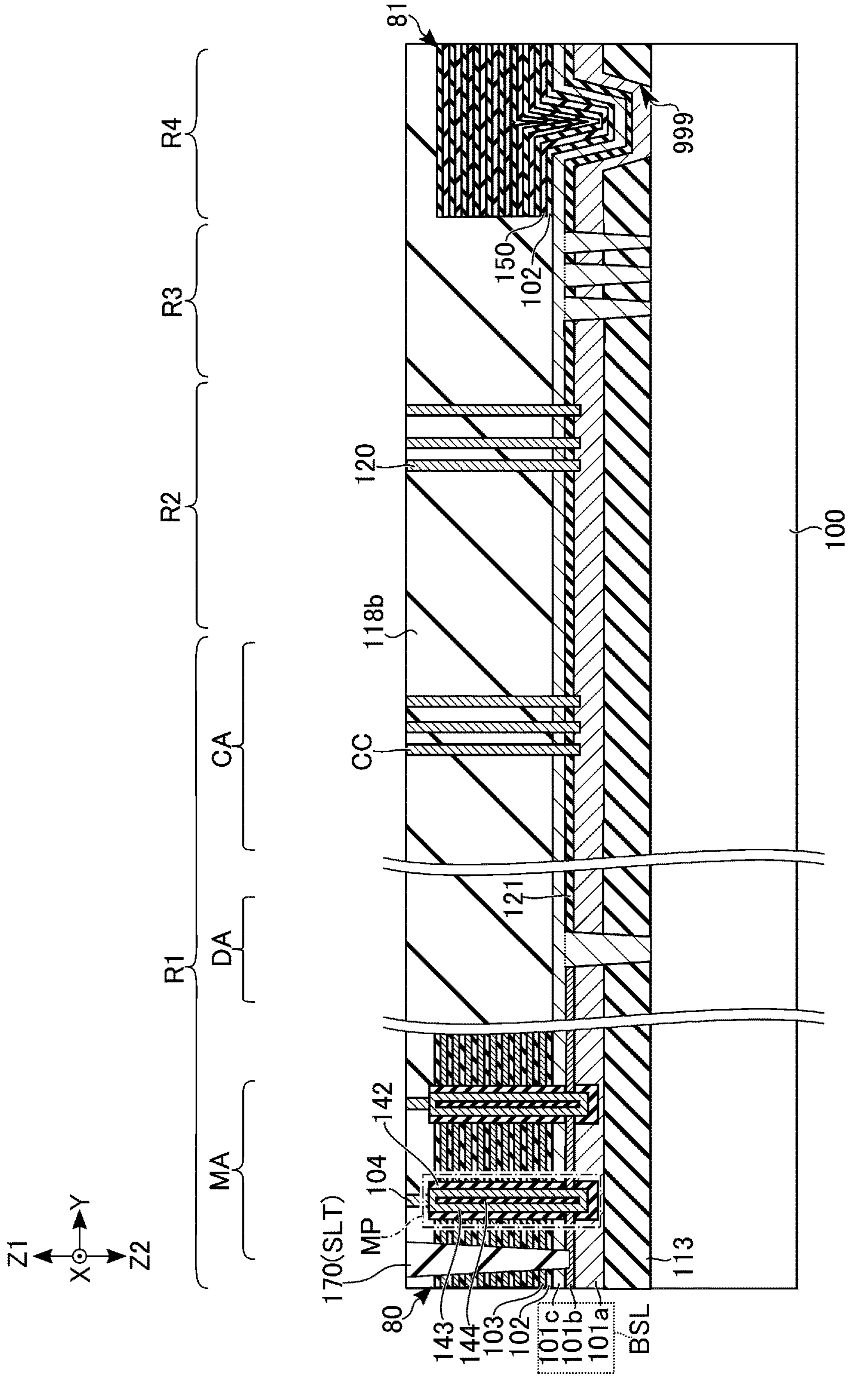
FIG. 16 is a sectional step chart showing a step of the method of manufacturing the memory device according to the embodiment.

As shown in FIG. 16, after the slit SLT is filled with the insulator 170, the conductor 104 is formed on an upper part of the memory pillar MP in the memory cell array area MA.

In the contact area CA, the contact plug CC is formed in the insulating layer 118*b*. In the wall region R2, a plurality of conductors (wall structures) 120 are formed in the insulating layer 118*b*. For example, the contact plug CC has a columnar structure. For example, the wall structures 120 have an approximately rectangular annular shape as viewed from the Z direction. Ends (bottom parts) on the side of the Z2 direction of the contact plug CC and the wall structures 120 reach the inside of the semiconductor layer 101 (for example, the semiconductor layer 101*a*).

Subsequently, using known techniques, a multi-layer interconnect structure including the plurality of interconnects 106 and 108 and the plurality of conductors (via plugs) 105, 107, and 109 is formed on a side of a surface facing the Z1 direction of the insulating layer 118*b*. Furthermore, the electrode 111 used in the bond pad BP is formed in the insulating layer 119 on the multi-layer interconnect structure.

Due to the manufacturing steps described above, the array chip 10 in the memory device 1 according to the present embodiment is formed.

The CMOS circuit chip 20 is formed using known techniques by manufacturing steps which differ from the manufacturing steps of the array chip 10.

(2-2) Method of Manufacturing Bond Structure

An example of a method of manufacturing a bond structure in the memory device 1 according to the present embodiment will be described with reference to FIGS. 17 to 21. Each of FIGS. 17 to 21 is a sectional view showing an example of a manufacturing step of the bond structure of the memory device 1.

Figure 17:
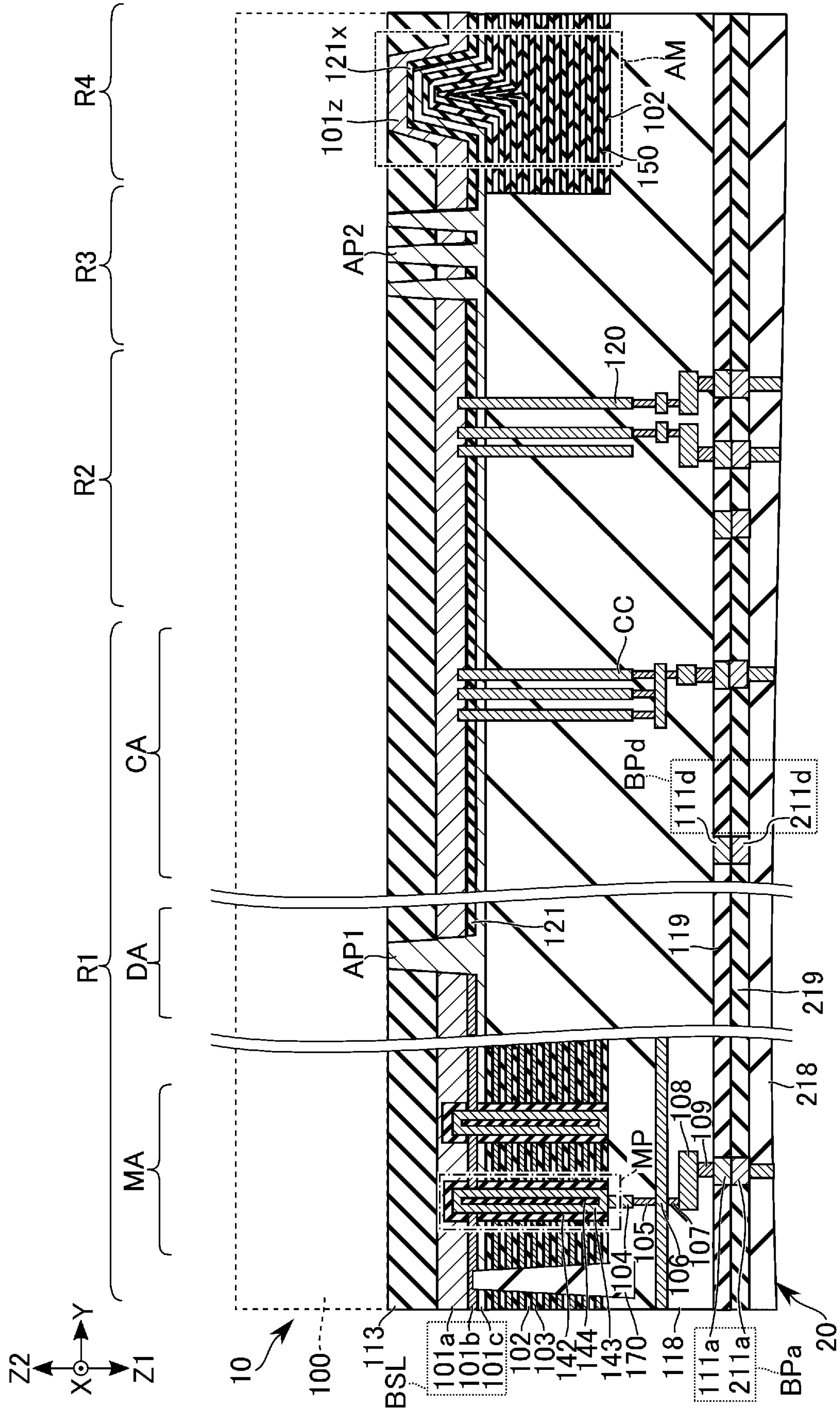
FIG. 17 is a sectional step chart showing a step of the method of manufacturing the memory device according to the embodiment.

As shown in FIG. 17, the array chip 10 and the CMOS circuit chip 20 are bonded to each other. The electrode 111 of the array chip 10 comes into contact with the electrode 211 of the CMOS circuit chip 20. Due to the contact between the electrode 111 and the electrode 211, the bond pad BP is formed on the bond surface BF of the two semiconductor chips 10 and 20. Accordingly, the array chip 10 is connected to the CMOS circuit chip 20 by the bond pad BP.

After the two semiconductor chips 10 and 20 are bonded, the semiconductor substrate 100 is removed by, for example, CMP (Chemical Mechanical Polishing).

In the plane separation area DA and the outer peripheral region R3, a surface facing the Z2 direction of the discharge plug AP (semiconductor layer 101) is exposed by the removal of the semiconductor substrate 100. In the kerf region R4, a surface facing the Z2 direction of the semiconductor layer 101*z* of the alignment mark AM is exposed by the removal of the semiconductor substrate 100.

Figure 18:
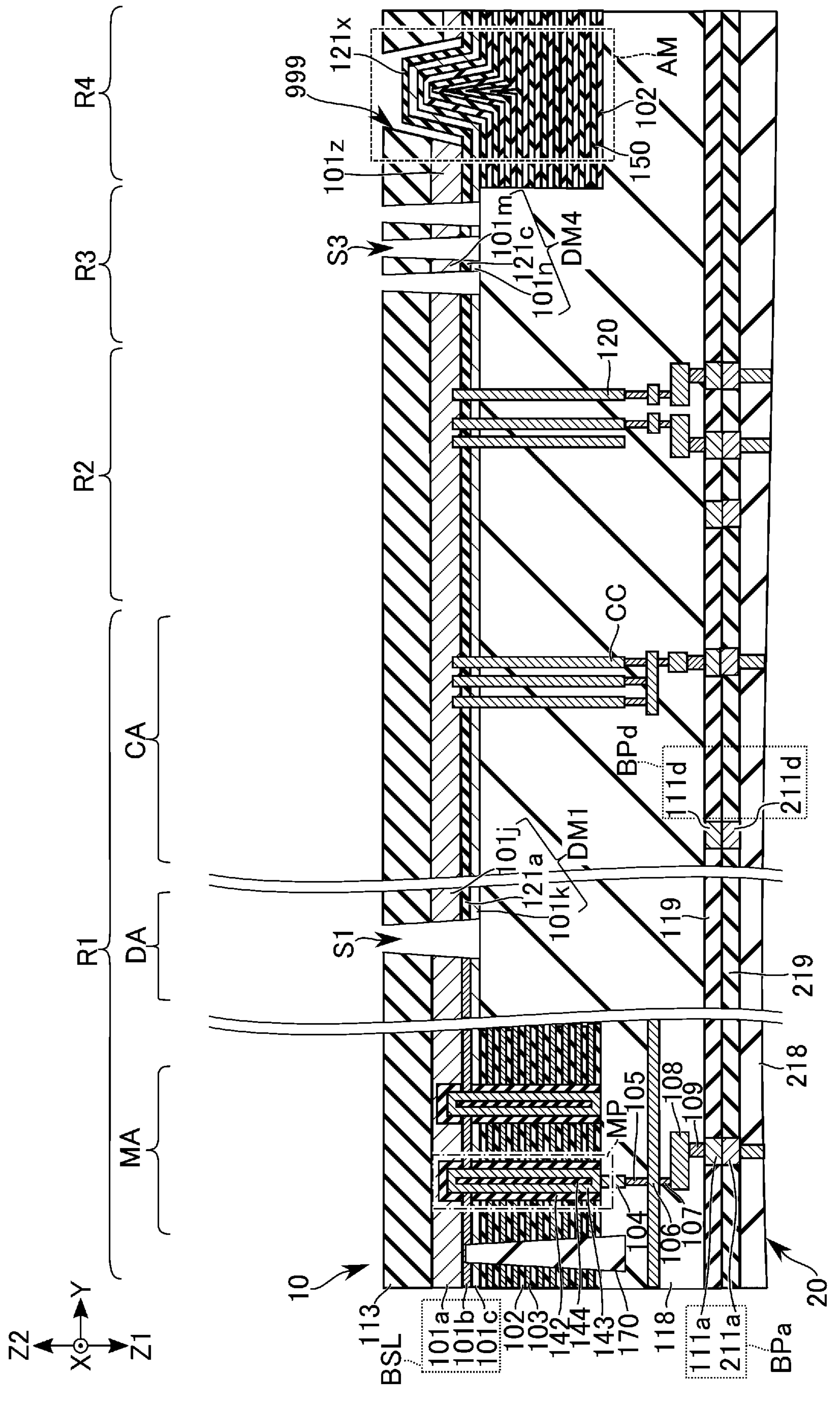
FIG. 18 is a sectional step chart showing a step of the method of manufacturing the memory device according to the embodiment.

As shown in FIG. 18, in the plane separation area DA and the outer peripheral region R3, the discharge plugs (semiconductor layers) in the slits S1 and S3 are removed from inside the slits S1 and S3. Accordingly, spaces are formed inside the slits S1 and S3 of the insulating layer 113.

In addition, due to the removal of the discharge plug in the slit S1, the dummy layer DM1 including the semiconductor layers 101*j* and 101*k* and the insulating layer 121*a* is formed in the plane separation area DA. The dummy layer DM1 is separated from the source line layer BSL. Due to the removal of the discharge plug in the slit S3, the dummy layer DM4 including the semiconductor layers 101*m* and 101*n* and the insulating layer 121*c* is formed in the outer peripheral region R3.

The insulating layer 118 and the dummy layers DM1 and DM4 are exposed via the slits S1 and S3.

In the alignment mark AM of the kerf region R4, the semiconductor layer 101*z* in the opening 999 is removed by a step common to the removal of the discharge plug. The insulating layer 121*x* in the opening 999 is exposed. In the vicinity of the opening 999, the semiconductor layer 101*z* remains between the insulating layer 113 and the insulating layer 121*x* in the Z direction.

Figure 19:
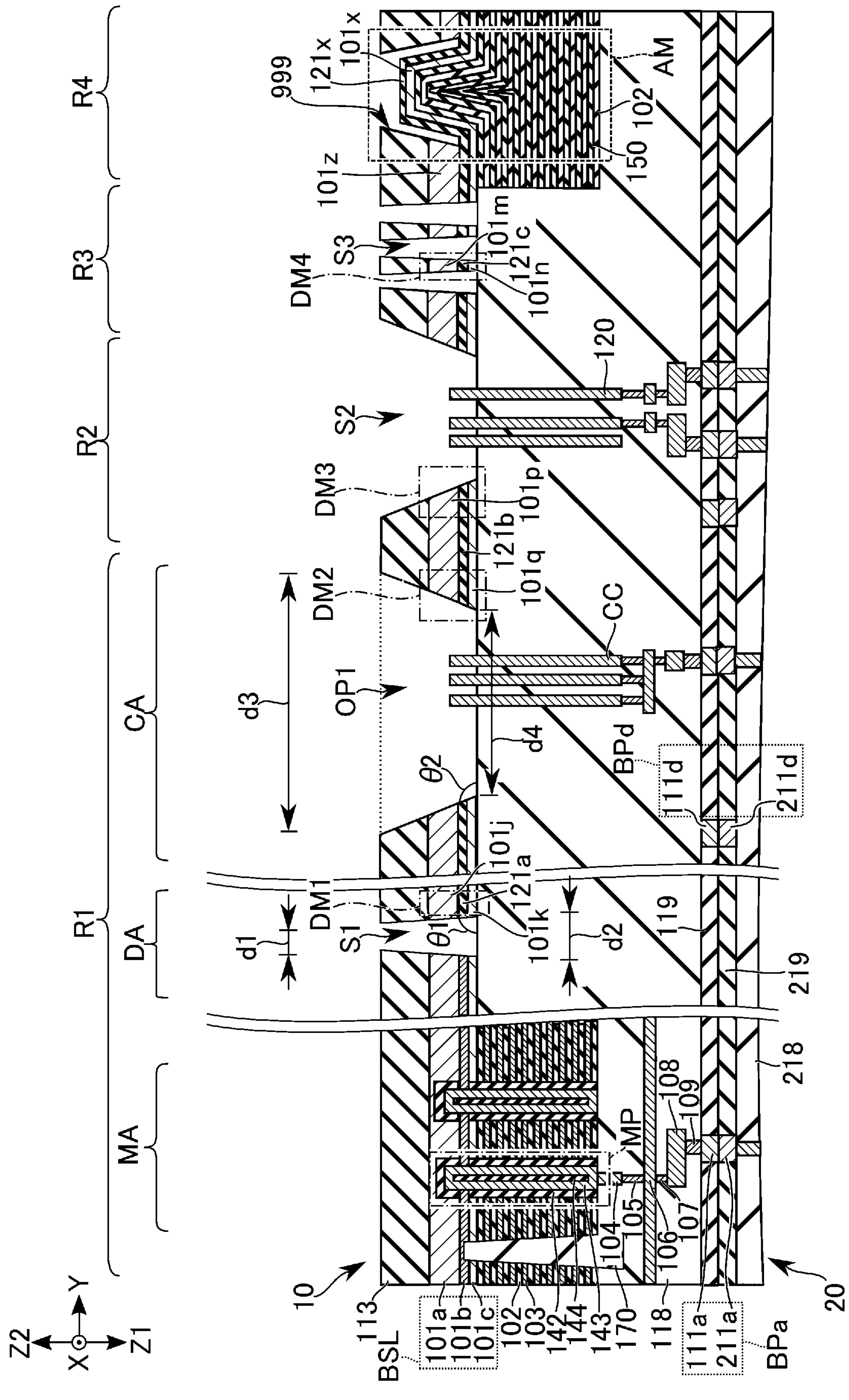
FIG. 19 is a sectional step chart showing a step of the method of manufacturing the memory device according to the embodiment.

As shown in FIG. 19, a plurality of openings OP1 is formed in the contact area CA by photolithography and etching. Each opening OP1 has a rectangular shape as viewed from the Z direction. An end on the side of the Z2 direction of the contact plug CC is exposed via the openings OP1. Due to the formation of the openings OP1, the dummy layer DM2 including the semiconductor layers 101*p* and 101*q* and the insulating layer 121*b* is formed in the contact area CA.

The slit S2 is formed in the wall region R2 by a step common to the formation of the opening OP1. The slit S2 has a rectangular annular shape as viewed from the Z direction. Due to the formation of the slit S2, the dummy layer DM3 including the semiconductor layers 101*p* and 101*q* and the insulating layer 121*b* is formed in the wall region R2.

Due to the formation of the opening OP1, a side surface of the dummy layer DM2 of the contact area CA is exposed. A gradient is created on the side surface of the dummy layer DM2. The opening OP1 has a tapered sectional shape as viewed from the X direction (and the Y direction).

The opening OP1 is formed by etching from a surface on the side of the Z2 direction toward a surface on the side of the Z1 direction. Therefore, a dimension d3 in the Y direction on the side of the Z2 direction of the opening OP1 is larger than a dimension d4 in the Y direction on the side of the Z1 direction of the opening OP1.

As a result, an orientation of a tapered shape of the opening OP1 is opposite with respect to an orientation of a tapered shape of the slit S1 (and the slit S3). In this manner, the opening OP1 with a forward tapered shape is formed in the contact area CA. In contrast, a dimension d1 in the Y direction on the side of the Z2 direction of the slit S1 is smaller than a dimension d2 in the Y direction on the side of the Z1 direction of the slit S1. Therefore, the slit S1 with an inverse tapered shape (or a non-tapered shape) is formed in the plane separation area DA. In addition, the slit S3 with an inverse tapered shape (or a non-tapered shape) is formed in the outer peripheral region R3.

An etching condition for forming the opening OP1 is set to a condition of a relatively low etching rate as compared to the etching condition of the slits S1 and S3. Therefore, an angle θ2 formed between the side surface of the dummy layer DM2 in the opening OP1 and a part parallel to the Y direction (or the X direction) on the side of the CMOS circuit chip 20 (a taper angle θ2 of the opening OP1) is an obtuse angle larger than 90 degrees. The angle θ2 of the opening OP1 is more separated from 90 degrees than the angle θ1 of the slits S1 and S3.

A gradient of a side surface of the dummy layer DM2 (a side surface of the semiconductor layer 101) in the contact area CA is separated from 90 degrees as compared to a gradient of the side surface of the dummy layer DM1 (a side surface of the semiconductor layer 101) in the plane separation area DA.

The dummy layer DM3 in the wall region R2 is processed by a step that is concurrent with the dummy layer DM2 in the contact area CA. Accordingly, the slit S2 with a forward tapered shape is formed in the wall region R2. A gradient of the side surface of the dummy layer DM3 in the wall region R2 is substantially the same as a gradient of the side surface of the dummy layer DM2 in the contact area CA. A taper angle of the slit S2 of the wall region R2 is substantially the same as the angle θ2 of the opening OP1 in the contact area CA. The taper angle of the slit S2 is an angle which is larger than 90 degrees. For example, a dimension in the Y direction of the slit S2 differs from a dimension in the Y direction of the opening OP1.

Figure 20:
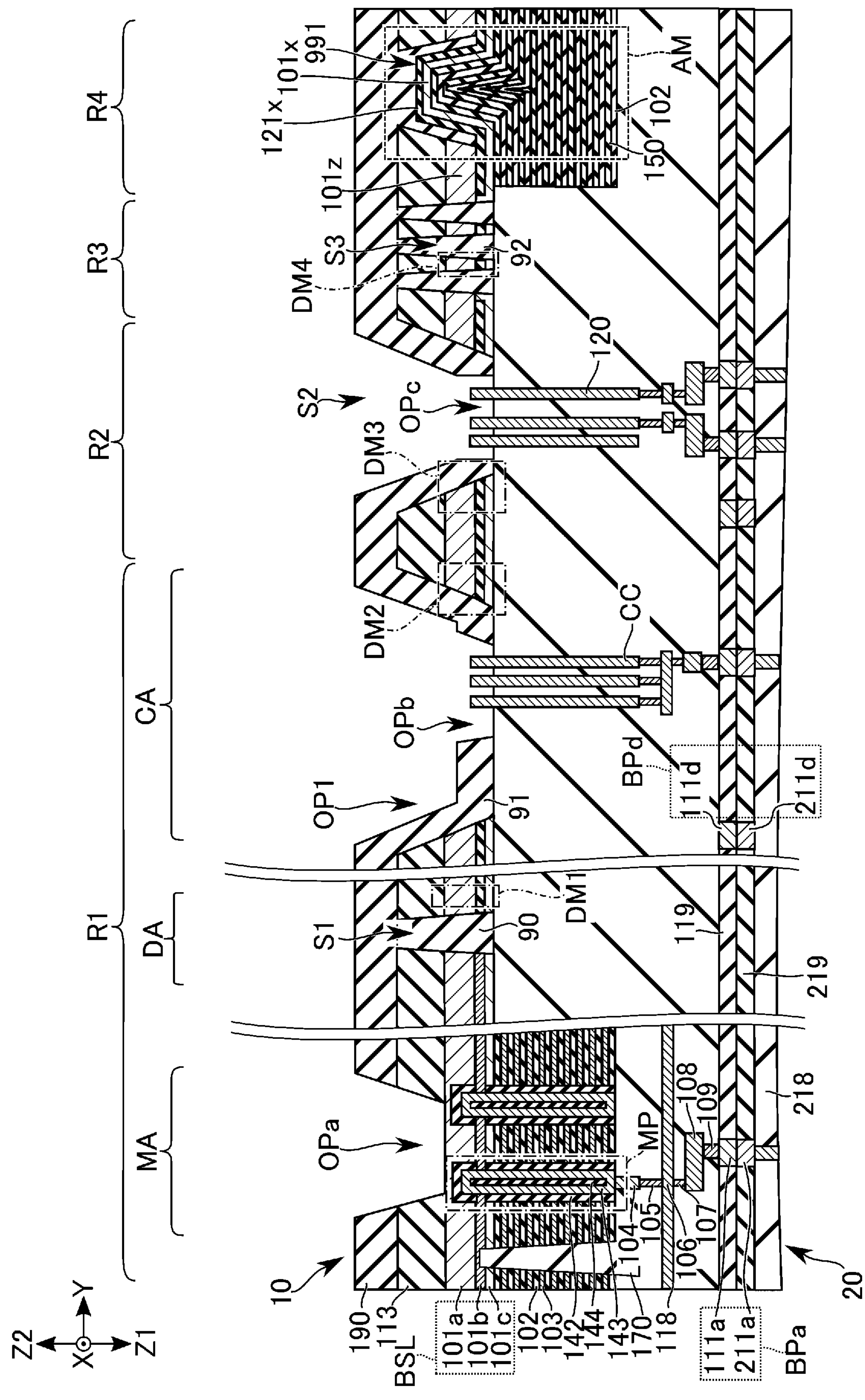
FIG. 20 is a sectional step chart showing a step of the method of manufacturing the memory device according to the embodiment.

As shown in FIG. 20, the insulating layer 190 is formed on a side of a surface facing the Z2 direction of the array chip 10.

The insulating layer 190 is embedded in the slit S1 in the plane separation area DA and in the slit S3 in the outer peripheral region R3. Accordingly, an insulator as the separation member 90 is formed in the slit S1. An insulator as the embedded member 92 is formed in the slit S3.

Due to the separation member 90, the source line layers BSL of the respective memory cell array areas MA are electrically separated from each other. In addition, in a boundary region between the memory cell array area MA and the contact area CA, the source line layers BSL are electrically separated from the dummy layer DM1 by the separation member 90. In this manner, the dummy layer DM1 (and the dummy layer DM4) is electrically separated from other members by embedment of the insulator as the separation member 90 (and the insulator as the embedded member 92).

In the kerf region R4, the insulating layer 190 is formed on the insulating layer 121*x* of the alignment mark AM. The opening 999 is filled with the insulating layer 190. The insulating layer 190 comes into contact with a curved part of the insulating layer 121*x*. The insulating layer 190 is provided between the insulating layer 121*x* of the projected part 991 of the alignment mark AM and the semiconductor layer 101*z* in the opening 999.

The insulating layer 190 is formed in the opening OP1 of the contact area CA and in the slit S2 of the wall region R2.

The part 91 of the insulating layer 190 covers a side surface of the dummy layer DM2 in the opening OP1. The insulating layer 190 covers a side surface of the dummy layer DM3 in the slit S2. For example, the inside of the opening OP1 and the inside of the slit S3 are not filled by the insulating layer 190.

In the memory cell array area MA, the opening OPa is formed in the insulating layer 190 and the insulating layer 113 by photolithography and etching. A surface facing the Z2 direction of the semiconductor layer 101*a* is exposed via the opening OPa. For example, the opening OPa has a forward tapered shape as viewed from the X direction.

For example, openings OPb and OPc are formed in the insulating layer 190 by a step common to the formation of the opening OPa. The opening OPb is formed in the insulating layer 190 that covers the contact area CA at a position overlapping with the contact plug CC in the Z direction. An end on the side of the Z2 direction of the contact plug CC is exposed via the opening OPb. The opening (slit) OPc with a rectangular annular shape is formed in the insulating layer 190 that covers the wall region R2 at a position overlapping with the wall structure 120 in the Z direction. An end on the side of the Z2 direction of the wall structure 120 is exposed via the opening OPc.

Figure 21:
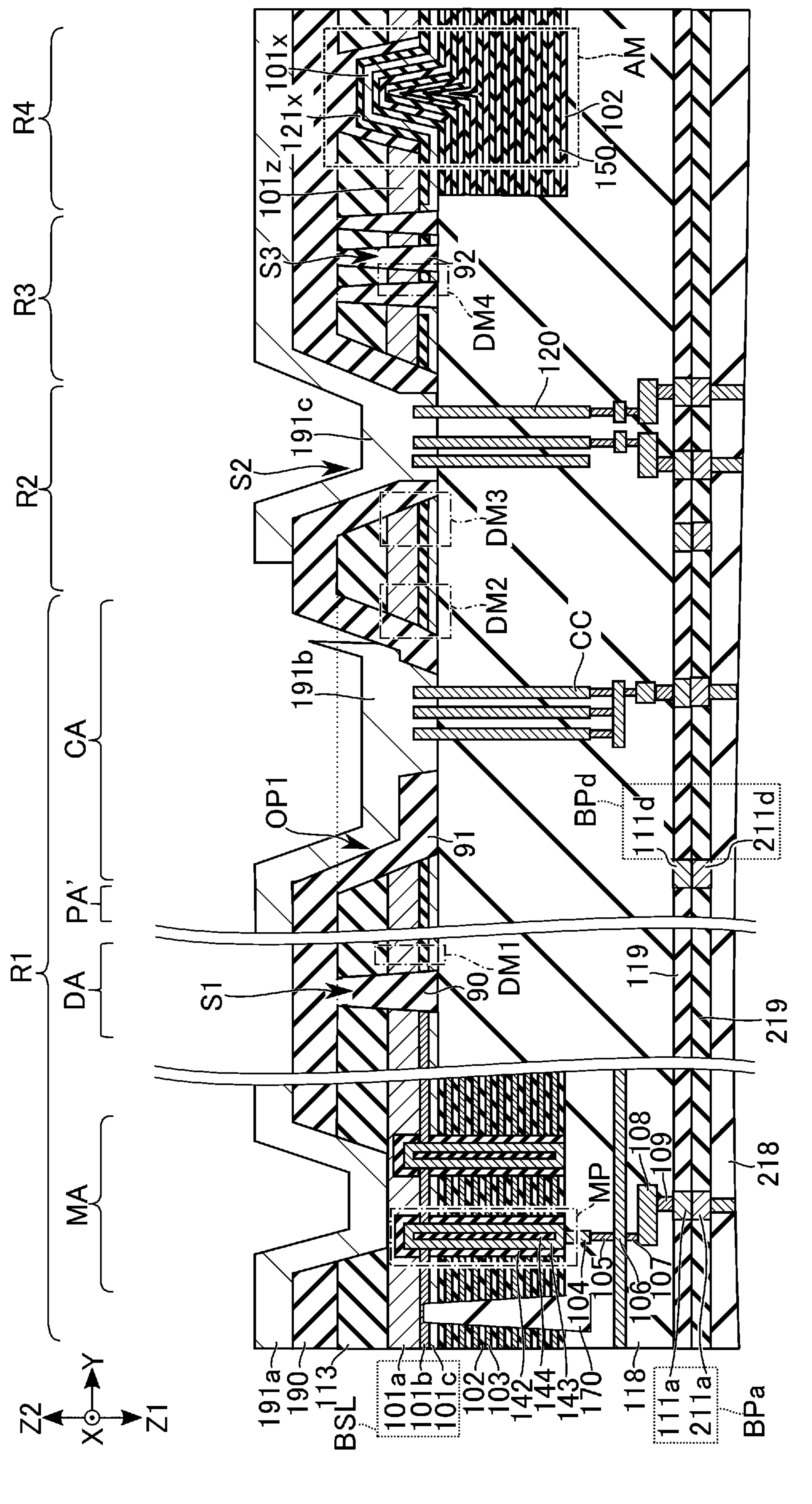
FIG. 21 is a sectional step chart showing a step of the method of manufacturing the memory device according to the embodiment.

As shown in FIG. 21, the plurality of interconnects 191 (191*a*, 191*b*, and 191*c*) are formed on a side of a surface facing the Z2 direction of the array chip 10.

In the memory cell array area MA, the interconnect 191*a* is formed on the source line layer BSL and the insulating layers 113 and 190. The interconnect 191*a* comes into contact with the semiconductor layer 101*a*. Accordingly, the interconnect 191*a* is electrically connected to the semiconductor layer 101*a*. The interconnect 191*a* functions as a backing interconnect with respect to the source line layer BSL.

In the contact area CA, the interconnect 191*b* is formed in the opening OP1. The interconnect 191*b* comes into contact with the contact plug CC. The interconnect 191*b* covers the side surface of the dummy layer DM2 via the part 91 of the insulating layer 190. The interconnect 191*b* extends, via the side surface of the dummy layer DM2, from the bottom part of the opening OP1 to a region PA' above a surface (upper surface) facing the Z2 direction of the dummy layer DM2.

In the wall region R2, the interconnect 191*c* is formed in the slit S2. The interconnect 191*c* comes into contact with the wall structure 120. The interconnect 191*c* covers the side surface of the dummy layer DM3 via the insulating layer 190. The interconnect 191*c* extends, via the side surface of the dummy layer DM3, from the bottom part of the slit S2 to a region above a surface facing the Z2 direction of the dummy layer DM3.

Subsequently, as shown in FIG. 5, the insulating layers 192 and 193 and the surface protective layer 198 are sequentially formed on a side of a surface facing the Z2 direction of the array chip 10.

The opening OPz is formed in the surface protective layer 198 and the insulating layers 192 and 193 at a position (for example, the pad area PA) which overlaps with the interconnect 191*b* in the Z direction. Accordingly, a part of the interconnect 191*b* exposed via the opening OPz forms the pad 99 which functions as an external connecting terminal.

Due to the manufacturing steps described above, the memory device 1 with the bond structure according to the present embodiment is completed.

(3) Modifications

Modifications of the memory device 1 according to the embodiment will be described with reference to FIGS. 22 to 24.

Figure 22:
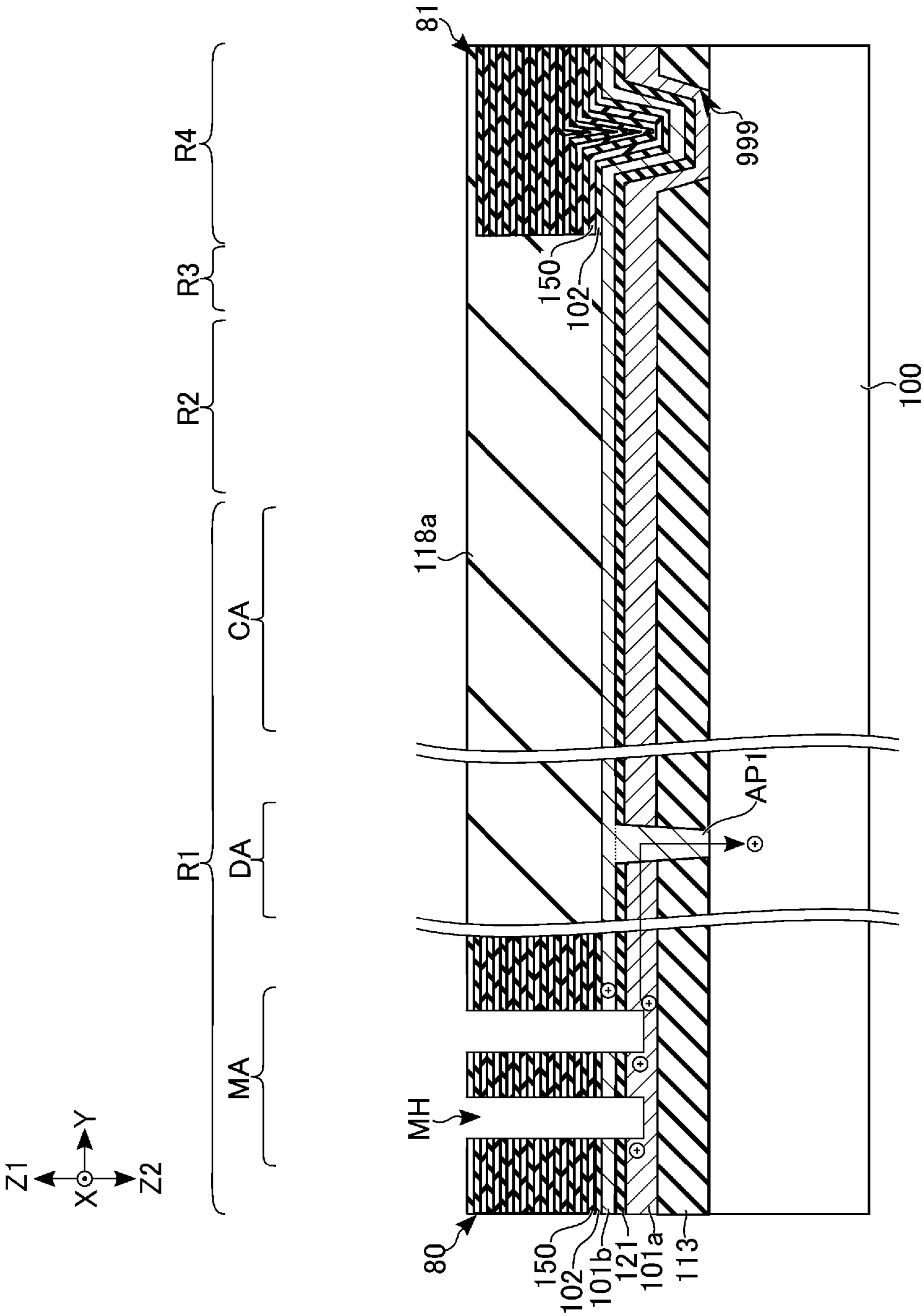
FIG. 22 is a diagram for describing a modification of the memory device according to the embodiment.
Figure 23:
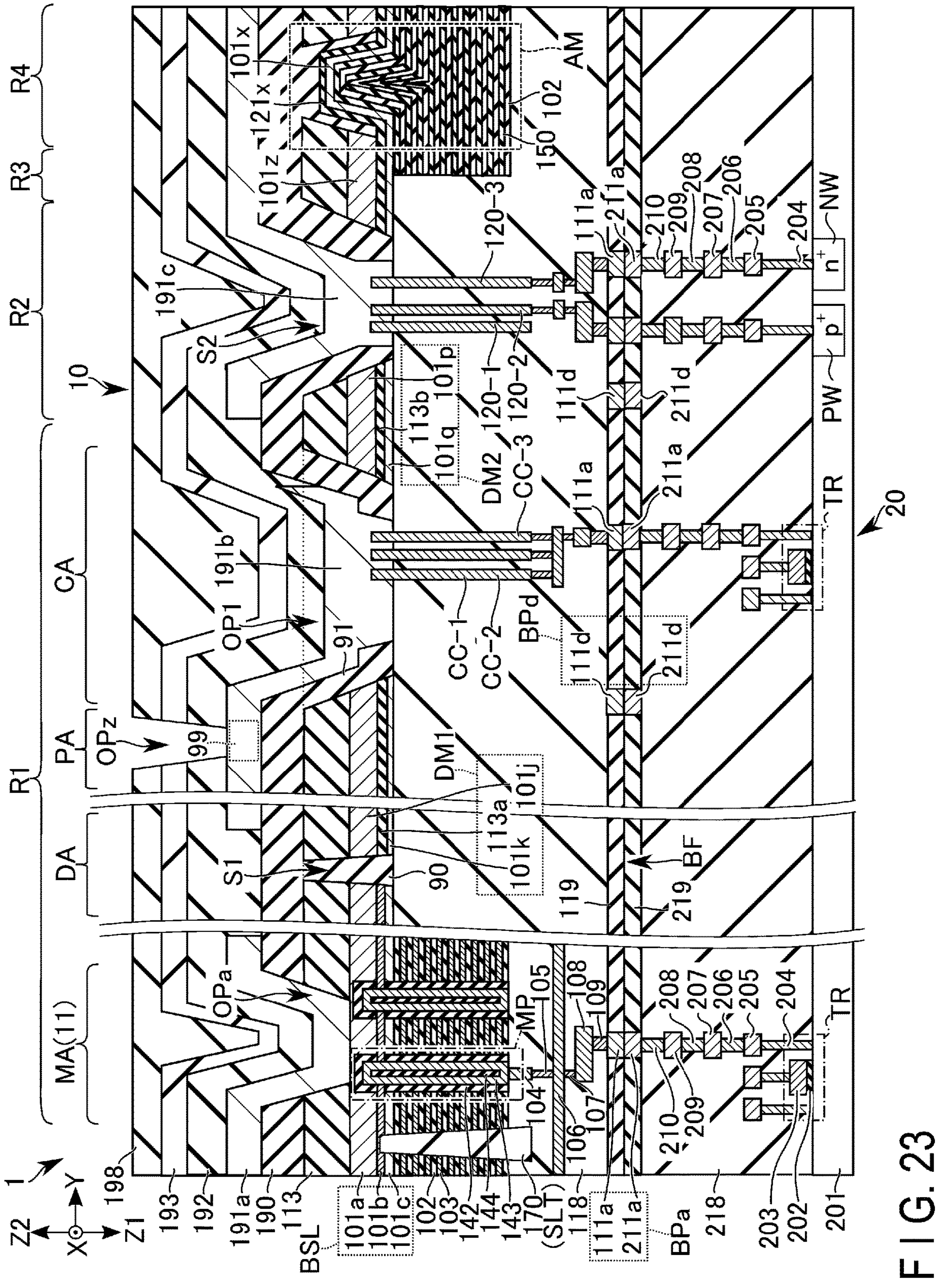
FIG. 23 is a sectional view showing a structure of the modification of the memory device according to the embodiment.

FIGS. 22 and 23 are sectional views showing an example of a modification of the memory device 1 according to the embodiment.

As shown in FIG. 22, the memory device 1 according to the modification does not include the discharge plug AP2 in the outer peripheral region R3.

As described above, in the manufacturing steps of the memory device 1, the semiconductor layer 101*c* in the slit S1 of the plane separation area DA functions as the discharge plug AP1. As a result, a discharge plug need not be provided in the outer peripheral region R3.

Therefore, as shown in FIG. 23, the memory device 1 according to the modification can eliminate a space for arranging a discharge plug in the outer peripheral region R3 without having to provide a slit and a member to be embedded in the slit of the outer peripheral region R3.

As a result, the memory device 1 according to the modification can reduce a chip size of the array chip 10.

Figure 24:
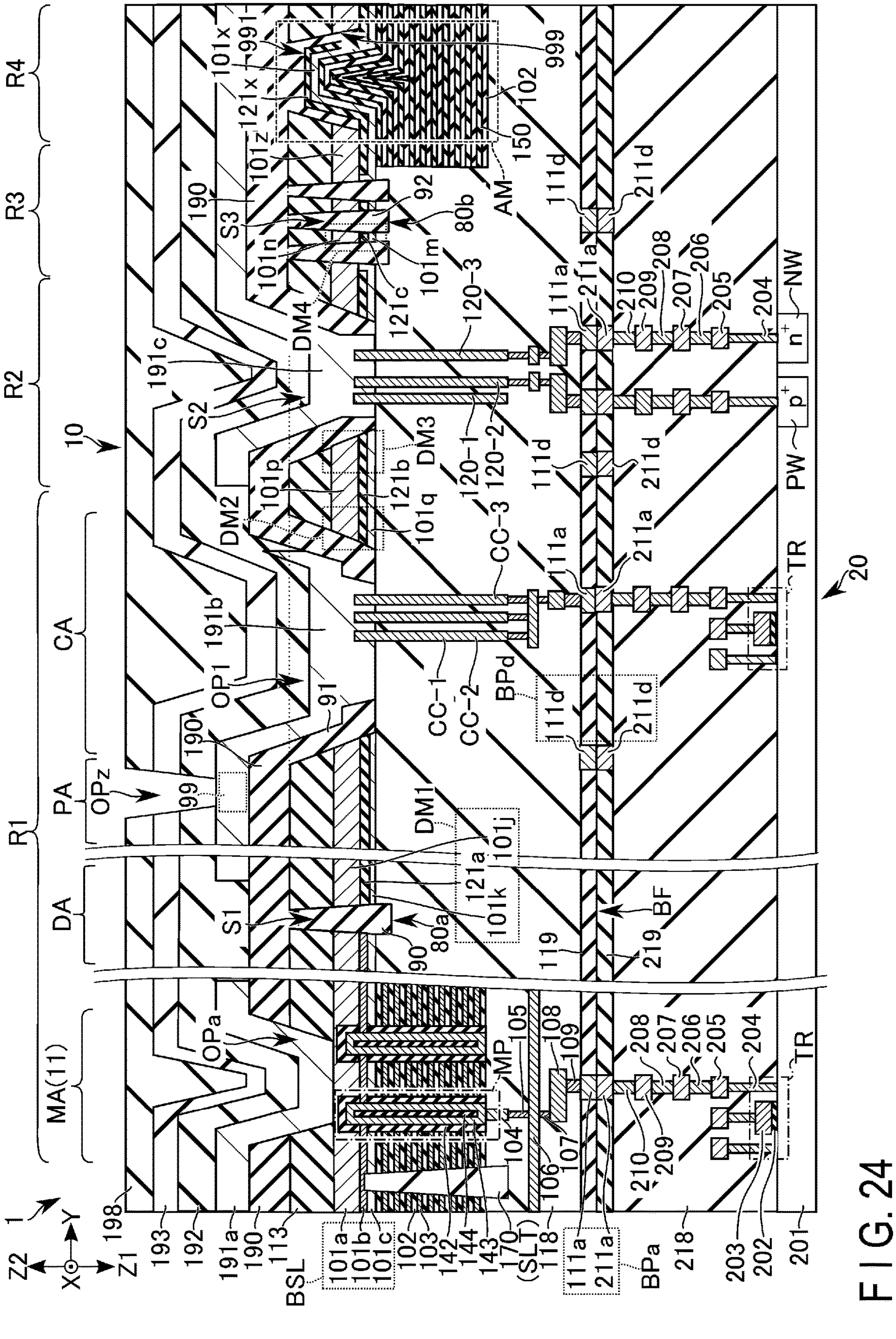
FIG. 24 is a sectional view showing a structure of a modification of the memory device according to the embodiment.

FIG. 24 is a sectional view showing another example of a modification of the memory device 1 according to the embodiment.

As shown in FIG. 24, a groove 80*a* may be provided in a part of the insulating layer 118 in the plane separation area DA. The groove 80*a* is provided at a position overlapping with the slit S1 in the Z direction. The groove 80*a* has a grid-like shape as viewed from the Z direction.

For example, the groove 80*a* is formed on a surface facing the Z2 direction of the insulating layer 118 by the removal step of the semiconductor layer 101*c* in the slit S1 and/or the formation step of the opening OP1 in the contact area CA after the removal of the semiconductor layer 101*c* in the slit S1 (refer to FIG. 18 and FIG. 19).

Due to the formation of the groove 80*a*, the position of the surface facing the Z2 direction of the insulating layer 118 in the plane separation area DA locally recedes toward a side of the CMOS circuit chip 20 than the position of the surface facing the Z2 direction of the insulating layer 118 in the contact area CA.

For example, a groove 80*b* is formed in a part of the insulating layer 118 concurrently with the formation of the groove 80*a* at a position overlapping in the Z direction with the slit S3 in the outer peripheral region R3. For example, the groove 80*b* has an approximately rectangular annular shape as viewed from the Z direction.

Note that a groove may be provided on a surface facing the Z2 direction of the insulating layer 118 in the contact area CA and/or the wall region R2. Due to the formed groove, the position of the surface facing the Z2 direction of the insulating layer 118 in the contact area CA may locally recede toward a side of the CMOS circuit chip 20 (a side of the semiconductor substrate 201) than the position of the surface facing the Z2 direction of the insulating layer 118 in the plane separation area DA. Due to the formed groove, the position of the surface facing the Z2 direction of the insulating layer 118 in the wall region R2 may locally recede toward a side of the CMOS circuit chip 20 than the position of the surface facing the Z2 direction of the insulating layer 118 in the plane separation area DA. The groove formed in a part of the insulating layer 118 of the contact area CA has, for example, a rectangular shape as viewed from the Z direction. The groove formed in a part of the insulating layer 118 of the wall region R2 has, for example, an approximately rectangular annular shape as viewed from the Z direction.

In this manner, the memory device 1 according to the modification may have a structure in which the insulating layer 118 is locally engraved in the plane separation area DA and the outer peripheral region R3 or in other regions.

Note that the discharge plug AP2 constituted of a conductor in the outer peripheral region R3 need not be removed from the outer peripheral region R3. In this case, in the outer peripheral region R3, a semiconductor layer which is embedded in the slit S3 when manufacturing the memory device 1 and which is caused to function as a conductor of the discharge plug AP2 is provided in the slit S3 as the embedded member 92 in place of an insulator.

(4) Others

As described above, the memory device 1 according to the present embodiment includes the dummy layer DM1 including the opening (slit) S1 with a first tapered shape (or a non-tapered shape) in the plane separation area DA and the dummy layer DM2 including the opening OP1 with a second tapered shape in the contact area CA.

In the present embodiment, for example, an orientation of the tapered shape of the opening S1 of the plane separation area DA differs from an orientation of the tapered shape of the opening OP1 of the contact area CA.

Regarding the opening S1, the dimension d1 in a direction parallel to the XY plane on the side of the Z2 direction is equal to or smaller than the dimension d2 in a direction parallel to the XY plane on the side of the Z1 direction. Regarding the opening OP1, the dimension d3 in a direction parallel to the XY plane on the side of the Z2 direction is larger than the dimension d4 in a direction parallel to the XY plane on the side of the Z1 direction. For example, the dimension d2 is smaller than the dimension d3 and the dimension d4.

An angle θ1 formed between the side surface of the dummy layer DM1 in the slit S1 and a part (for example, an upper part of the insulating layer 118) parallel to the Y direction on the side of the CMOS circuit chip 20 (for example, a taper angle θ1 of the slit S1) is equal to or smaller than 90 degrees. An angle θ2 formed between the side surface of the dummy layer DM2 in the opening OP1 and a part (for example, an upper part of the insulating layer 118) parallel to the Y direction on the side of the CMOS circuit chip 20 (for example, a taper angle θ2 of the opening OP1) is larger than 90 degrees. The angle θ1 is closer to 90 degrees than the angle θ2.

In this manner, an angle (gradient) of the side surface of the dummy layer DM1 in which the slit S1 is formed approaches an angle perpendicular to a main surface (XY plane) of the semiconductor substrate 201. Consequently, a dimension in a direction parallel to the main surface of the semiconductor substrate 201 of the slit S1 can be further narrowed.

Therefore, in the present embodiment, an area of the plane separation area DA is reduced. As a result, the memory device 1 according to the present embodiment can reduce a chip size.

A connecting member such as a bonding wire is electrically connected to the interconnect 191*b* in the contact area CA via the opening OPz. Therefore, a relatively large current flows through the interconnect 191*b* during operation of the memory device 1.

In the event that the gradient of the side surface of the dummy layer DM2 (a taper angle of the opening OP1) approaches 90 degrees in the contact area CA of the array chip 10, a film thickness of the interconnect 191*b* on the side surface of the dummy layer DM2 tends to become thinner. In this case, the interconnect 191*b* with the thin film thickness becomes susceptible to disconnection due to electromigration.

In the present embodiment, the interconnect 191*b* is formed on the side surface of the dummy layer DM2 with a relatively small gradient in accordance with the tapered shape of the opening OP1. Accordingly, the film thickness of the interconnect 191*b* on the side surface of the dummy layer DM2 can be made thicker. As a result, resistance to electromigration of the interconnect 191*b* improves.

Therefore, the memory device 1 according to the present embodiment can suppress disconnection of the interconnect 191*b* which is attributable to electromigration.

As described above, the memory device 1 according to the present embodiment can reduce chip cost. In addition, the memory device 1 according to the present embodiment can improve production yield of memory devices.

Therefore, the memory device 1 according to the present embodiment can reduce manufacturing costs of memory devices.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:

a first chip which includes a substrate and a circuit on the substrate; and a second chip which is bonded to the first chip, wherein the second chip includes a first region and a second region which encloses the first region, the first region includes:

a first area which includes a first source line and a first memory cell array connected to the first source line;

a second area which includes a first layer provided at a first height same as the first source line in a first direction perpendicular to a surface of the substrate and a contact portion provided in a first opening formed in the first layer, the contact portion including a member which extends in the first direction from the first opening and which is electrically connected to the circuit; and a third area which includes a first structure provided in a second opening formed in a layer at the first height between the first area and the second area, the first opening has a tapered shape in which a dimension in a second direction of a part on a side of the first chip of the first opening is smaller than a dimension in the second direction of a part on a side of the second chip of the first opening, the second direction being parallel to the surface of the substrate, and an angle formed between a side surface of the second opening and a part on the side of the first chip of the second opening is closer to 90 degrees than an angle formed between a side surface of the first opening and the part on the side of the first chip of the first opening, the second region includes:

a second structure which extends in the first direction from a third opening formed in a layer at the first height towards a side of the first chip, the third opening has a tapered shape in which a dimension in the second direction of a part on the side of the first chip of the third opening is smaller than a dimension in the second direction of a part on the side of the second chip of the third opening, and the second structure has an annular structure which encloses the first region.

2. The memory device according to claim 1, wherein the angle formed between the side surface of the second opening and the part on the side of the first chip of the second opening is equal to or smaller than 90 degrees, and the angle formed between the side surface of the first opening and the part on the side of the first chip of the first opening is larger than 90 degrees.

3. The memory device according to claim 1, wherein the second opening has a shape in which a dimension in the second direction of the part on the side of the first chip of the second opening is equal to or larger than a dimension in the second direction of a part on the side of the second chip of the second opening.

4. The memory device according to claim 3, wherein the dimension in the second direction of the part on the side of the first chip of the second opening is smaller than the dimension in the second direction of the part on the side of the first chip of the first opening.

5. The memory device according to claim 1, wherein the first opening has a forward tapered shape, the second opening has a shape that differs from the forward tapered shape, the angle formed between the side surface of the first opening and the part on the side of the first chip of the first opening is an obtuse angle, and the angle formed between the side surface of the second opening and the part on the side of the first chip of the second opening is an acute angle or a right angle.

6. The memory device according to claim 1, wherein the second chip further includes:

a third region which encloses the first region, the third region includes:

a third structure which is provided in a fourth opening formed in a layer at the first height, and an angle formed between a side surface of the fourth opening and a part on the side of the first chip of the fourth opening is closer to 90 degrees than the angle formed between the side surface of the first opening and the part on the side of the first chip of the first opening.

7. The memory device according to claim 1, wherein the second chip further includes:

a fourth region which encloses the first region and which includes an end of the second chip, and the fourth region includes:

an alignment mark which includes a member projecting into a fifth opening formed in a layer at the first height; and a first insulating layer which is provided between a side surface of the fifth opening and a side surface of the member projecting into the fifth opening.

8. The memory device according to claim 1, wherein the first source line includes:

a first semiconductor layer and a second semiconductor layer arranged in the first direction; and a third semiconductor layer between the first semiconductor layer and the second semiconductor layer in the first direction; and the first layer includes:

a fourth semiconductor layer and a fifth semiconductor layer arranged in the first direction; and a second insulating layer between the fourth semiconductor layer and the fifth semiconductor layer in the first direction.

9. The memory device according to claim 8, wherein the first structure separates the first layer from the first source line.

10. The memory device according to claim 1, wherein the second chip further includes:

a fourth area which includes a second source line and a second memory cell array connected to the second source line, the third area includes a sub-area which extends between the first area and the fourth area, and the first structure in the sub-area separates the second source line from the first source line.

11. A memory device comprising:

a first chip which includes a substrate and a circuit on the substrate; and a second chip which is bonded to the first chip, wherein the second chip includes:

a first area which includes a first source line and a first memory cell array connected to the first source line;

a second area which includes a first layer provided at a first height same as the first source line in a first direction perpendicular to a surface of the substrate and a contact portion provided in a first opening formed in the first layer, the contact portion including a member which extends in the first direction from the first opening and which is electrically connected to the circuit;

a third area which includes a first structure provided in a second opening formed in a layer at the first height between the first area and the second area, and a fourth area which includes a second source line and a second memory cell array connected to the second source line, the first opening has a tapered shape in which a dimension in a second direction of a part on a side of the first chip of the first opening is smaller than a dimension in the second direction of a part on a side of the second chip of the first opening, the second direction being parallel to the surface of the substrate, the second opening has a shape in which a dimension in the second direction of a part on the side of the first chip of the second opening is equal to or larger than a dimension in the second direction of a part on the side of the second chip of the second opening, the third area includes a sub-area which extends between the first area and the fourth area, and the first structure in the sub-area separates the second source line from the first source line.

12. The memory device according to claim 11, wherein an angle formed between a side surface of the second opening and the part on the side of the first chip of the second opening is closer to 90 degrees than an angle formed between a side surface of the first opening and the part on the side of the first chip of the first opening.

13. The memory device according to claim 12, wherein the angle formed between the side surface of the second opening and the part on the side of the first chip of the second opening is equal to or smaller than 90 degrees, and the angle formed between the side surface of the first opening and the part on the side of the first chip of the first opening is larger than 90 degrees.

14. The memory device according to claim 11, wherein the second chip further includes:

a first region which includes the first to fourth areas; and a second region which encloses the first region, the second region includes:

a second structure which is provided in a third opening formed in a layer at the first height, and the third opening has a shape in which a dimension in the second direction of a part on the side of the first chip of the third opening is equal to or larger than a dimension in the second direction of a part on the side of the second chip of the third opening.

15. The memory device according to claim 11, wherein the second chip further includes:

a first region which includes the first to fourth areas; and a third region which encloses the first region, the third region includes:

a third structure which extends in the first direction from a fourth opening formed in a layer at the first height towards a side of the first chip, the fourth opening has a tapered shape in which a dimension in the second direction of a part on the side of the first chip of the fourth opening is smaller than a dimension in the second direction of a part on the side of the second chip of the fourth opening, and the third structure has an annular structure which encloses the first region.

16. The memory device according to claim 11, wherein the second chip further includes:

a first region which includes the first to fourth areas; and a fourth region which encloses the first region and which includes an end of the second chip, and the fourth region includes:

an alignment mark which includes a member projecting into a fifth opening formed in a layer at the first height; and a first insulating layer which is provided between a side surface of the fifth opening and a side surface of the member projecting into the fifth opening.

17. The memory device according to claim 11, wherein the first source line includes:

a first semiconductor layer and a second semiconductor layer arranged in the first direction; and a third semiconductor layer between the first semiconductor layer and the second semiconductor layer in the first direction; and the first layer includes:

a fourth semiconductor layer and a fifth semiconductor layer arranged in the first direction; and a second insulating layer between the fourth semiconductor layer and the fifth semiconductor layer in the first direction.

18. The memory device according to claim 17, wherein the first structure separates the first layer from the first source line.

* * * * *